(12) United States Patent
Hirama

(10) Patent No.: US 8,179,209 B2
(45) Date of Patent: May 15, 2012

(54) COMPLEX RESONANCE CIRCUIT

(76) Inventor: Koichi Hirama, Hiratsuka (JP)

( * ) Notice: Subject to any disclaimer, the term of this patent is extended or adjusted under 35 U.S.C. 154(b) by 688 days.

(21) Appl. No.: 12/304,715

(22) PCT Filed: Jun. 7, 2007

(86) PCT No.: PCT/JP2007/061514
§ 371 (c)(1),
(2), (4) Date: Dec. 12, 2008

(87) PCT Pub. No.: WO2007/145127
PCT Pub. Date: Dec. 21, 2007

(65) Prior Publication Data
US 2009/0251234 A1   Oct. 8, 2009

(30) Foreign Application Priority Data
Jun. 15, 2006  (JP) .................. 2006-165957

(51) Int. Cl.
*H03H 7/18* (2006.01)
*H03H 9/205* (2006.01)
(52) U.S. Cl. .................. 333/167; 333/189; 333/204
(58) Field of Classification Search .............. 333/175, 333/186, 189, 204, 167, 169; 331/135
See application file for complete search history.

(56) References Cited

U.S. PATENT DOCUMENTS

| | | | |
|---|---|---|---|
| 5,821,833 A | 10/1998 | Lakin | |
| 6,741,146 B2 * | 5/2004 | Ella | 333/133 |
| 6,975,183 B2 * | 12/2005 | Aigner et al. | 333/187 |
| 7,098,758 B2 * | 8/2006 | Wang et al. | 333/189 |
| 7,116,186 B2 * | 10/2006 | Chen | 333/126 |
| 7,230,509 B2 * | 6/2007 | Stoemmer | 333/133 |
| 7,446,629 B2 * | 11/2008 | Nakamura et al. | 333/133 |
| 7,492,242 B2 * | 2/2009 | Carpentier | 333/189 |
| 7,495,528 B2 * | 2/2009 | Fukunaga | 333/132 |
| 7,554,422 B2 * | 6/2009 | Nakatsuka et al. | 333/133 |
| 7,737,805 B2 * | 6/2010 | Schmidhammer et al. | 333/187 |

FOREIGN PATENT DOCUMENTS

| | | |
|---|---|---|
| JP | 04-370742 | 12/1992 |
| JP | 10-174436 | 6/1998 |
| JP | 10-313216 | 11/1998 |
| JP | 11-295281 | 10/1999 |
| JP | 2000-196358 | 7/2000 |
| JP | 2002-111305 | 4/2002 |
| JP | 2004-519150 | 6/2004 |
| JP | 2004-223111 | 8/2004 |
| JP | 2005-072757 | 3/2005 |
| JP | 2005-253059 | 9/2005 |
| JP | 2006-003144 | 1/2006 |
| JP | 2006-029870 | 2/2006 |
| JP | 2006-109425 | 4/2006 |
| WO | 2006/046672 | 5/2006 |

* cited by examiner

*Primary Examiner* — Dean O Takaoka
*Assistant Examiner* — Alan Wong
(74) *Attorney, Agent, or Firm* — Sughrue Mion, PLLC

(57) ABSTRACT

A serial resonance circuit is prepared. The serial resonance circuit is configured of a pair of resonance circuit is configured of a pair of resonance elements serially connected to each other at a midpoint therebetween and exhibiting resonance frequencies equal to each other. To both ends of the serial resonance circuit, phase shift circuits that shift phases so that the phases are reverse to each other are connected. A resonance output obtained from the serial resonance circuit when AC power is supplied between the midpoint and an input side of the phase shift circuit is obtained as an external output.

10 Claims, 18 Drawing Sheets

FIG. 9
(a) 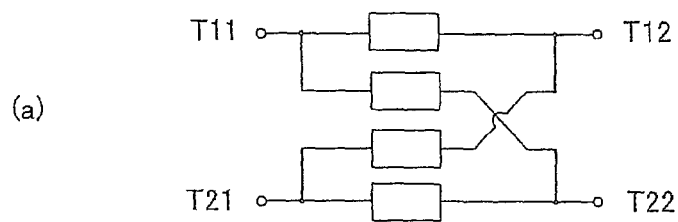
(b) 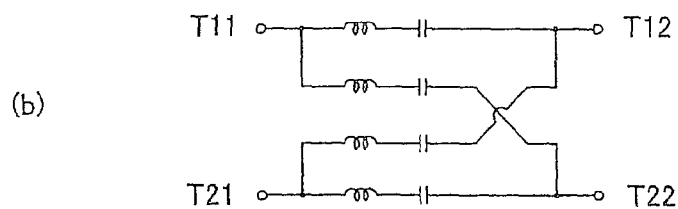
(c) 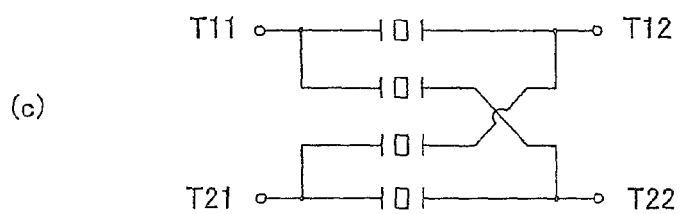
(d) 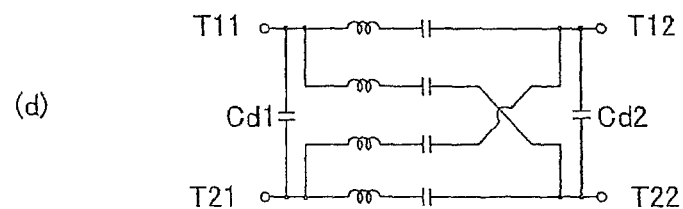
(e) 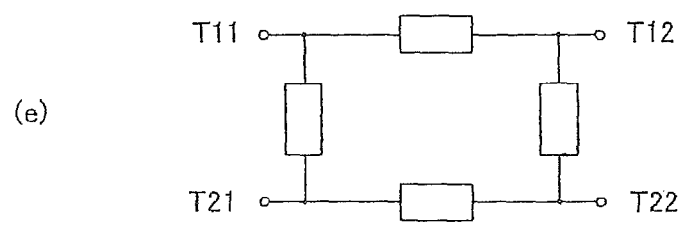

FIG. 10
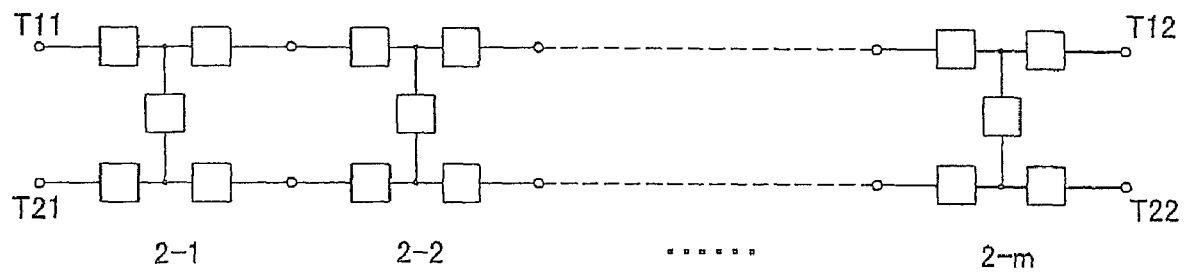
(a)
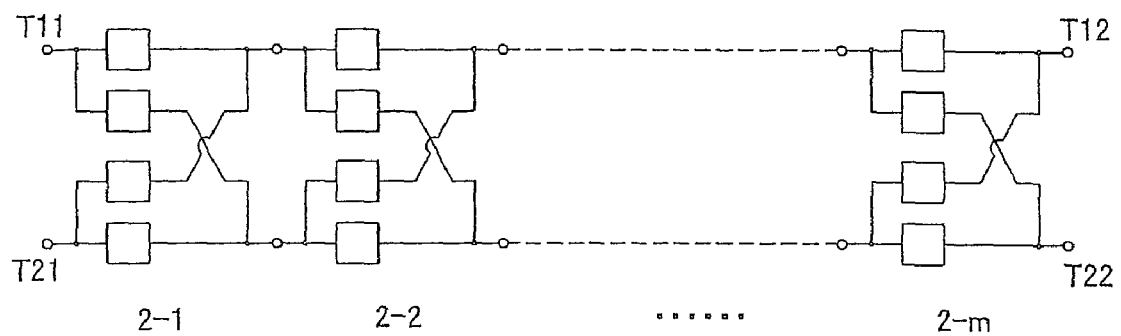
(b)

F I G . 11
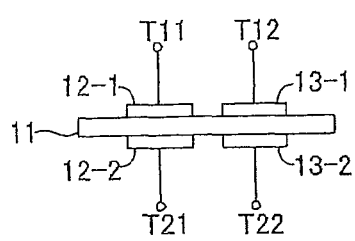
(a)
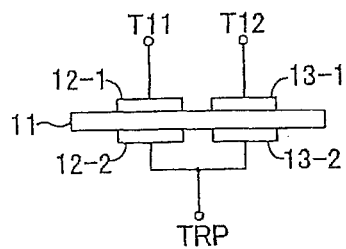
(b)
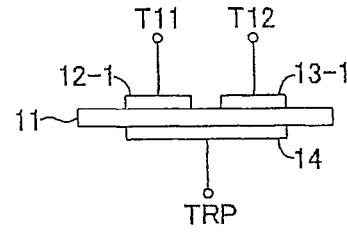
(c)
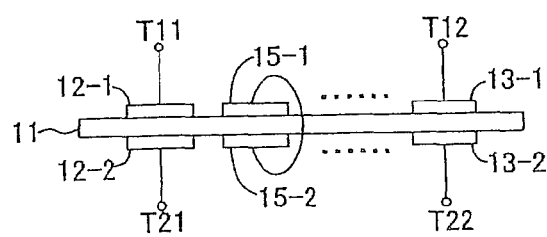
(d)
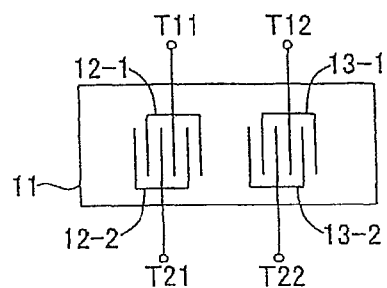
(e)
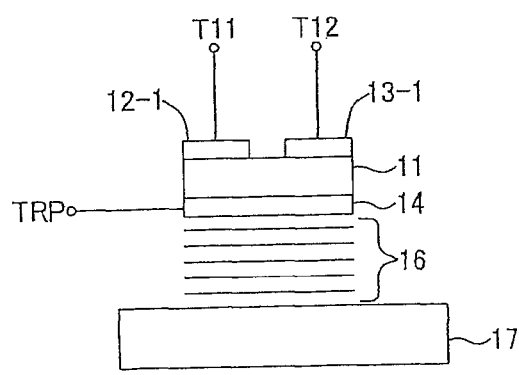
(f)

FIG. 12
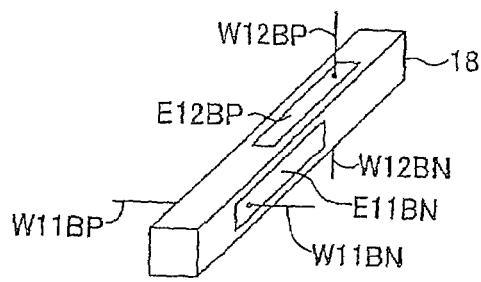
(a)
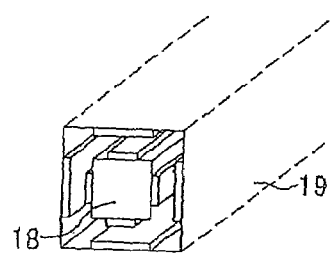
(b)
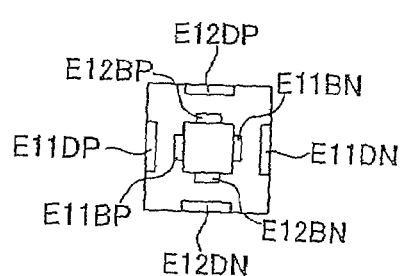
(c)
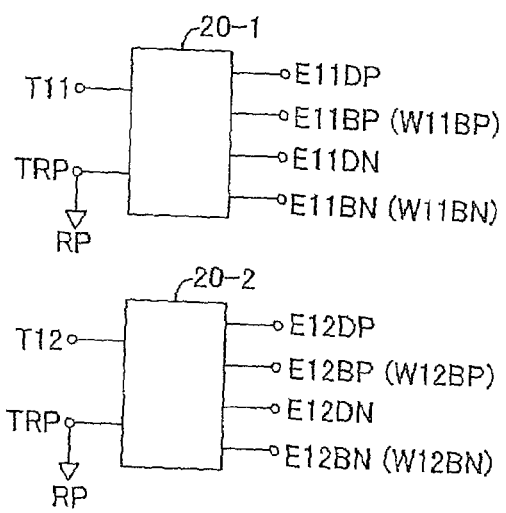
(d)

FIG. 13
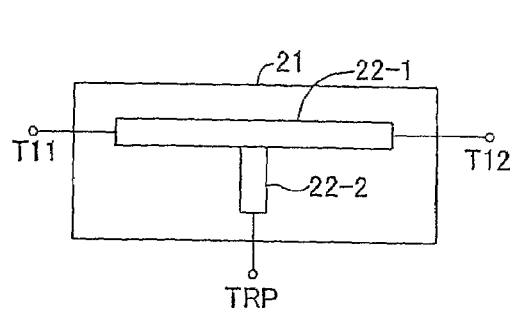
(a)
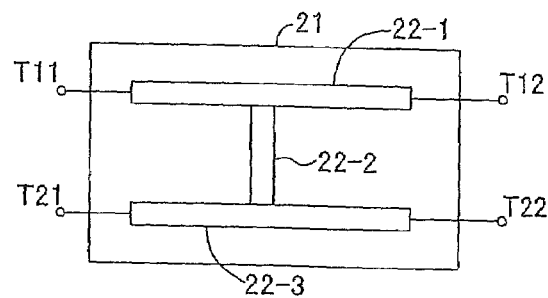
(b)
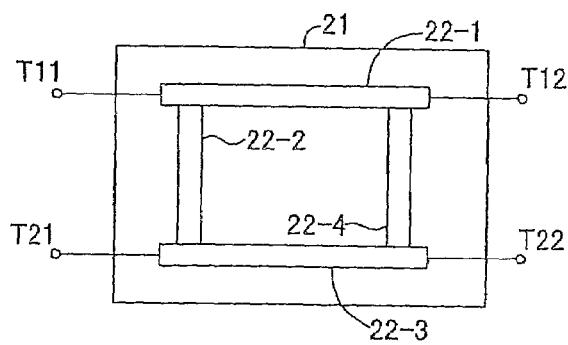
(c)
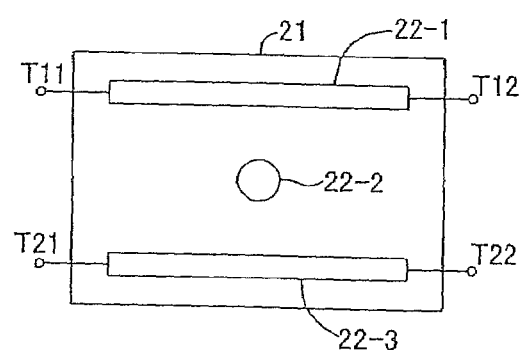
(d)

FIG. 17
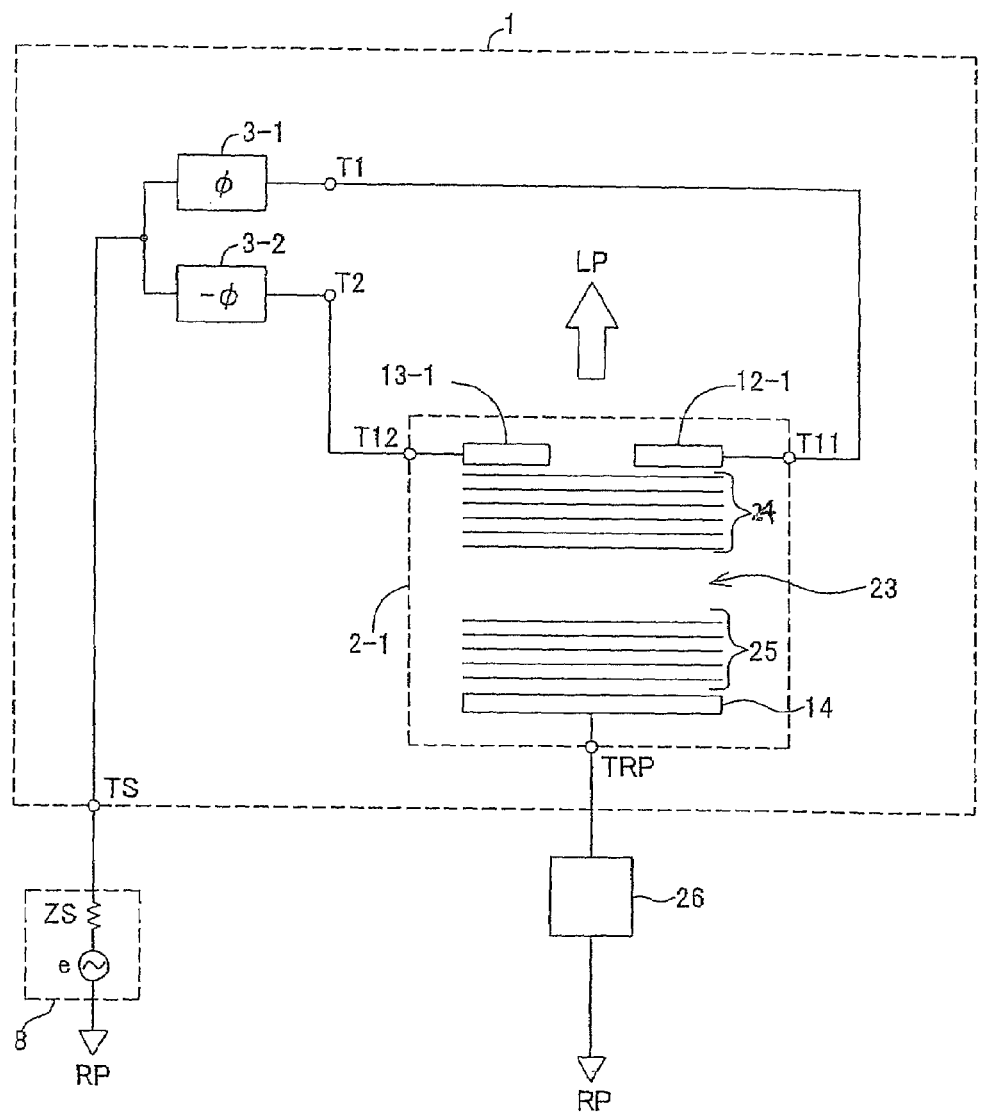
(a)
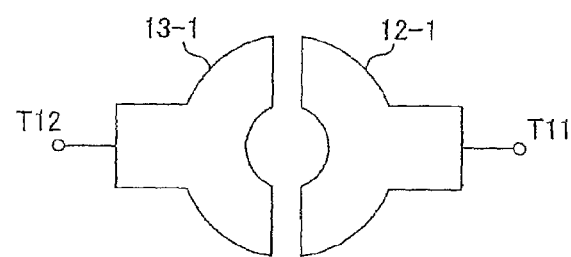
(b)

COMPLEX RESONANCE CIRCUIT

BACKGROUND OF THE INVENTION

1. Field of the Invention

In the present invention, electric signals having phases differences different from one another are applied to a complex resonator having natural resonance, thereby making it possible to continuously sweep a resonance frequency of the resonator.

The present invention is composed of a resonator made up of discrete electron devices or a resonator including a piezoelectric resonator, a Micro Electro Mechanical System (MEMS) resonator, an optical resonator and the like. The present invention relates to frequency variable devices such as ultrasonic transducers, radio antennas, photoelectric converters, and frequency oscillators.

2. Description of the Related Art

A frequency source (time source) with high signal purity is required for communication or observation equipment. Furthermore, there is a demand that the frequency of this frequency source should be variable over a broad frequency range. The required frequency range covers all the frequency domains from the ultrasonic range to the electromagnetic wave range, the lightwave range and the like.

Patent Documents 1 and 2 disclose an ultrasonic transducer for the ultrasonic range, the frequency of which, however, cannot be varied continuously.

Patent Document 3 discloses an antenna which can be switched between frequencies. However, the frequencies cannot be varied continuously.

Patent Document 4 discloses a method of varying a resonance frequency in the electromagnetic wave range by changing a signal path length by switches. However, the manner of varying the resonance frequency is gradual but not continuous, and thus, not suited for cases where precise frequency changes are required.

Patent Document 5 discloses a laser diode having three electrodes to output a lightwave whose wavelength is variable. However, the diode cannot produce a high-purity wavelength output because the dimension of the resonator is changed in this method.

Patent Documents 6 and 7 disclose a method of continuously varying a frequency of a ultrasonic wave by combining a piezoelectric resonator and a phase shifter.

However, a variable range of the frequency cannot exceed limits of a frequency range determined by an electromechanical coupling factor peculiar to the piezoelectric phenomenon. Further, this method has a critical defect that noise power within the range increases and thus purity of the frequency deteriorates as the variable range is made broader.

Patent Document 8 discloses a technique of controlling directivity of an antenna by changing the phase. However, it is impossible to vary a frequency at maximum sensitivity of the antenna.

Patent Document 9 discloses a method of continuously varying an antiresonance frequency of ultrasonic or electromagnetic wave by changing power distribution applied to two resonator units. However, since this method utilizes an antiresonance frequency, which has very small power value, this method has a defect that the frequency purity degrades due to external noises, and needs further improvements.

Patent Document 1:
  Japanese Patent Application Kokai No. 11-295281 (Japanese Patent Application No. 10-114130)
Patent Document 2:
  Japanese Patent Application Kokai No. 10-174436 (Japanese Patent Application No. 8-346591)
Patent Document 3:
  Japanese Patent Application Kohyo No. 2004-519150 (Japanese Patent Application No. 2002-563613)
Patent Document 4:
  Japanese Patent Application Kokai No. 2005-253059 (Japanese Patent Application No. 2005-26019)
Patent Document 5:
  Japanese Patent Application Kokai No. 2004-223111 (Japanese Patent Application No. 2004-28852)
Patent Document 6:
  Japanese Patent Application Kokai No. 2000-196358 (Japanese Patent Application No. 10-377053)
Patent Document 7:
  Japanese Patent Application Kokai No. 10-313216 (Japanese Patent Application No. 9-122493)
Patent Document 8:
  Japanese Patent Application Kokai No. 2006-109425 (Japanese Patent Application No. 2005-257600)
Patent Document 9:
  International Publication Pamphlet WO2006/046672

SUMMARY OF THE INVENTION

The present invention is directed to solving the problems described above and provides a complex resonance circuit having a broad frequency-adaptive band and broad frequency variable range, and capable of continuously varying a frequency and providing a frequency output of high signal purity or high conversion efficiency, and device applications therefor.

BRIEF DESCRIPTION OF THE DRAWINGS

FIG. 9 shows configurations of other circuits.

FIG. 10 shows configurations of cascade connected resonance units 2.

FIG. 11 conceptually illustrates configurations of examples wherein resonance units are composed of piezoelectric devices.

FIG. 12 conceptually illustrates a configuration of an example wherein a resonance unit is composed of a Micro Electro Mechanical System (MEMS) resonator.

FIG. 13 conceptually illustrates configurations of examples wherein resonance units are composed of stripline resonators.

FIG. 17 shows a configuration of an embodiment for a laser diode.

Figure 1:
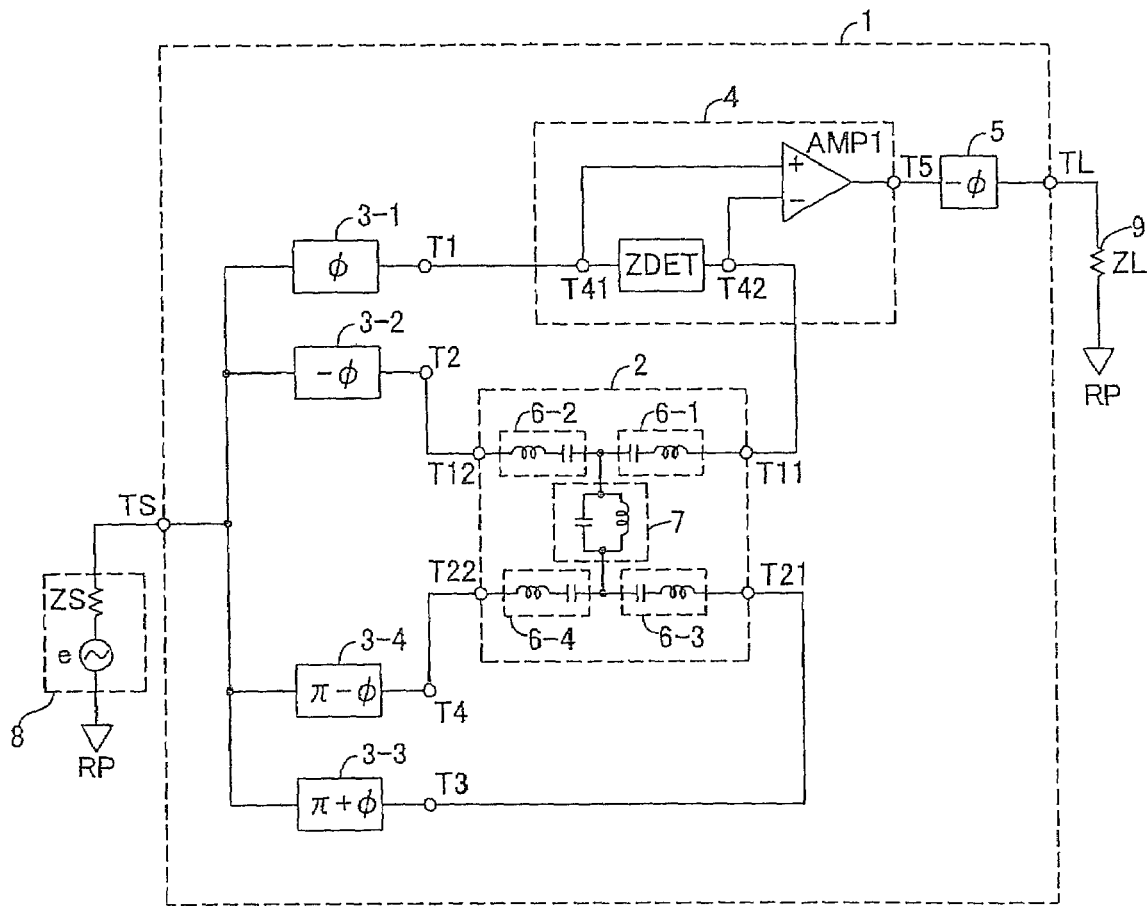
FIG. 1 shows a configuration of an embodiment of a complex resonance circuit 1.

EXPLANATION OF REFERENCE SYMBOLS 1 a complex resonance circuit
2 a resonance unit
3-1, 3-2, ..., and 3-n phase shift circuits
4 a resonance output circuit
5 a phase shift circuit
Z11, Z12, Z11, Z12, and ZK impedance elements
6-1, 6-2, 6-3, and 6-4 serial resonance characteristic elements
7 a reactance circuit
8 a frequency variable reference signal generator
9 a load resistor
10 a phase shift circuit
11 a piezoelectric plate
12-1, 12-2, 13-1, 13-2, 14, 15-1, and 15-2 electrodes
16 a multiple film layer
17 a substrate
18 a beam vibrator
19 a group of electrodes on inner walls
20-1 and 20-2 signal pattern converters
21 a substrate
22-1, 22-2, 22-3, and 22-4 striplines
23 an active layer
24 p-type distributed Bragg reflecting layers
25 n-type distributed Bragg reflecting layers
26 a DC power source
27 a selective absorbent layer
28 attached material

DETAILED DESCRIPTION OF THE INVENTION

Referring to Embodiment 1 shown in FIG. 1, a complex resonance circuit 1 of the present invention will de described. The complex resonance circuit 1 of the present invention is composed of a resonance unit 2, four phase shift circuits 3-1, 3-2, 3-3, and 3-4, a resonance output circuit 4, and a phase shift circuit 5. This complex resonance circuit 1 provides new means unprecedented in prior art. This means implements a function to continuously vary a frequency in a broad frequency variable range by changing only a control phase amount phi that characterizes a phase amount of the four phase shift circuits 3-1, 3-2, 3-3, and 3-4 that is to be varied, with various component values of the resonance unit 2 being fixed.

Referring to FIG. 1, the concrete configuration will be described hereinbelow. The complex resonance circuit 1 is made up of the following constituent elements: an input terminal TS; an output terminal TL; reference terminals RP; the resonance unit 2 having a first terminal T11, a second terminal T12, a third terminal T21, and a fourth terminal T22; the phase shift circuit 3-1 connected between the input terminal TS and a terminal T1 and shifts a phase by phi; the resonance output circuit 4 input terminals T41 and T42 thereof connected between the terminal T1 and the first terminal T11 of the resonance unit 2 and an output terminal thereof connected to a terminal T5; the phase shift circuit 5 connected between the terminal T5 and the output terminal TL and shifts a phase by phi; the phase shift circuit 3-2 connected between the input terminal TS and the second terminal T12 of the resonance unit 2 and shifts a phase by minus phi; the phase shift circuit 3-3 connected between the input terminal TS and the third terminal T21 of the resonance unit 2 and shifts a phase by pi puls phi; and the phase shift circuit 3-4 connected between the input terminal TS and the fourth terminal T22 of the resonance unit 2 and shifts a phase by pi minus phi. The resonance unit 2 is a complex resonance circuit characterized by including a reactance circuit 7. The reactance circuit 7 is connected between a midpoint of at least a pair of serial resonance characteristic elements 6-1 and 6-2, and a midpoint of at least a pair of serial resonance characteristic elements 6-3 and 6-4. The serial resonance characteristic elements 6-1 and 6-2 are connected between the first terminal T11 and the second terminal T12, an end of each of the elements 6-1 and 6-2 are connected to each other at a midpoint therebetween, and the elements 6-1 and 6-2 have a resonance frequency substantially identical to each other. The serial resonance characteristic elements 6-3 and 6-4 are connected between the third terminal T21 and the fourth terminal T22, an end of each of the elements 6-3 and 6-4 are connected to each other at a midpoint therebetween, and the elements 6-3 and 6-4 have a resonance frequency substantially identical to each other.

Next, the operation of the complex resonance circuit 1 will be described. A frequency variable reference signal generator 8 is connected between the input terminal TS and the reference terminal RP of the complex resonance circuit 1. A load ZL 9 is connected between the output terminal TL and the reference terminal RP.

Figure 3:
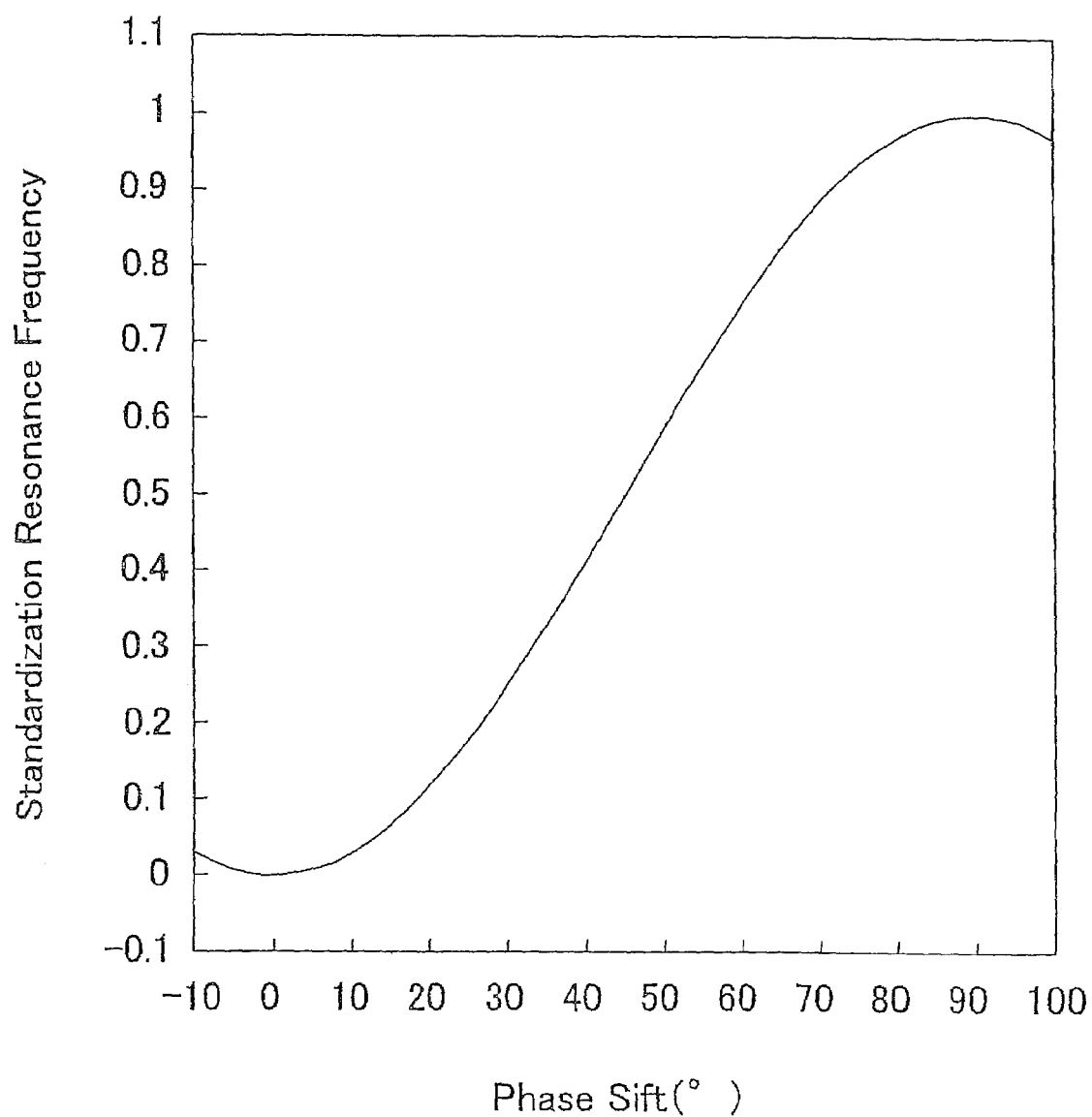
FIG. 3 shows frequency variable characteristics of the complex resonance circuit 1.

When an output frequency of the frequency variable reference signal generator 8 is varied with a control phase amount phi, which characterizes phase shift amounts of the four phase shift circuits 3-1, 3-2, 3-3, and 3-4, being fixed at a given value, let's say at phi 1, a maximum current flows through the load ZL when the frequency is FR1. In this phenomenon, the complex resonance circuit 1 acts like a series circuit of an inductance element and capacitance element as roughly shown in FIG. 2. When the control phase amount phi is changed to phi 2, a maximum current value appears at a frequency FR2, which is different from the frequency FR1. When the control phase amount phi is continuously varied, a frequency that gives a maximum value can be also continuously varied.

Where a resonance frequency of a phase shift amount phi at zero degrees is F0 and a resonance frequency of the phase shift amount phi at ninety degree is F90, when the phase shift amount phi is shifted within the range of zero to ninety degree, frequencies within the range of these two frequencies can be continuously swept. In other words, this resonance frequency FR is arbitrarily variable within a predetermined range by controlling the control phase amount phi. FIG. 3 quantitatively illustrates a relationship between the control phase amount phi and the resonance frequency FR. The horizontal axis shows the control phase amount phi. The vertical axis shows a value of the resonance frequency FR where values are standardized with F0 as zero and F90 as one.

When the resonance unit 2 is a distributed constant circuit, these two frequencies F0 and F90 are determined by a shape and size of the circuit and can be set arbitrary within a given range. A frequency difference between these two frequencies can be set beyond the limits of the electromechanical coupling factor. That is, the feature of the present invention is that a frequency can be continuously varied beyond the limits of the electromechanical coupling factor, which is a characteristic of piezoelectric devices. This is what the present invention has pioneered.

Figure 4:
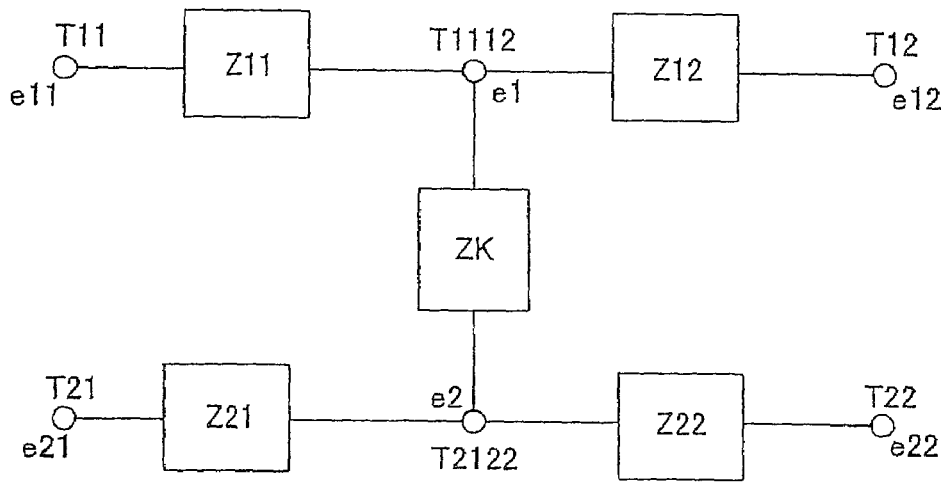
FIG. 4 illustrates a function of a resonance unit 2 of the complex resonance circuit 1.

Next, the principles for such operation will be described. The principles of varying a frequency, which is the subject matter of this invention, lie in the combination of the resonance unit 2 and the phase shift circuits 3-1, 3-2, 3-3, and 3-4. The configuration of this combination are extracted and explained referring to FIG. 4. The resonance unit 2 can be expressed as a balanced ladder lumped-parameter equivalent circuit as shown in FIG. 4. The resonance circuit 2 has a balanced ladder circuit formed by connecting a serial connection of serial resonance characteristic elements Z11 and Z12 between the terminals T11 and T12, a serial connection of serial resonance characteristic elements Z21 and Z22 between the terminals T21 and T22, and a reactance circuit ZK between midpoints of the two serial connections. Impedance elements provided in each branch that composes this equivalent circuit are made up of combination of elements that has inductance or capacitance. However, at this stage, the impedance elements are just referred to as impedance for the sake of convenience of explanation.

The effects of the four phase shift circuits 3-1, 3-2, 3-3, and 3-4 shown in FIG. 1 can be exerted in FIG. 4 by configuring the four voltages e11, e12, e21, and e22 respectively applied to the four terminals T11, T12, T21, and T22 as complex voltage.

Namely, in the circuit of FIG. 1, phases of signals applied to the four terminals of the resonance unit 2 have relationships of phi, minus phi, pi plus phi, and pi minus phi. Thus, two pairs of signals having electric power of reverse polarity are characterized by a control phase amount phi that shifts phases so that the phases are reverse to each other. The phenomenon that occurs in such a case can be described when the voltages applied to the terminals T11, T12, T21, and T22 are denoted by complex voltages e11, e12, e21, and e22, respectively. Furthermore, behavior of the whole complex resonance circuit can be described when attention is focused on two voltages of a voltage e1 of a terminal T1112 provided between impedances Z11 and Z12 and a voltage e2 of a terminal T2122 provided between impedances Z21 and Z22.

The relationship between the voltages e1 and e2, and applied voltages e11, e12, e21, and e22 is given by the following expression:

$$\begin{pmatrix} e_1 \\ e_2 \end{pmatrix} = \begin{pmatrix} \frac{1}{Z_{11}} + \frac{1}{Z_{12}} + \frac{1}{Z_k} & -\frac{1}{Z_k} \\ -\frac{1}{Z_k} & \frac{1}{Z_{21}} + \frac{1}{Z_{22}} + \frac{1}{Z_k} \end{pmatrix}^{-1} \begin{pmatrix} \frac{e_{11}}{Z_{11}} + \frac{e_{12}}{Z_{12}} \\ \frac{e_{21}}{Z_{21}} + \frac{e_{22}}{Z_{22}} \end{pmatrix}$$

[Expression 1]

The meaning of the expression (1) is as follows: The voltages e1 and e2 directly depend on the values obtained by dividing the applied voltages e11, e12, e21, and e22 respectively by the impedances Z11, Z12, Z21, and Z22. This means that even the values of the impedances Z11, Z12, Z21, and Z22 are far from desired values, the values of the voltages e1 and e2 can be brought closer to desired characteristics by increasing or decreasing the voltages applied.

Next, focus our attention on the first element of the second term on the right side of the expression (1). The applied voltages e11 and e12 that have passed through the phase shift circuits 3-1 and 3-2 shown in FIG. 3 have control phase amounts phi whose phases are reverse to each other. The sum of these voltages is given by the following expression:

$$\frac{e_{11}}{Z_{11}} + \frac{e_{12}}{Z_{12}} = A\sin\omega t \cdot \cos\phi$$

[Expression 2]

Here phi is a control phase amount, omega is an output frequency of the frequency variable reference signal generator 8, A is a coefficient uniquely determined by the configuration of the resonance unit 2 and has frequency characteristics.

This expression means that a virtual reference potential VRPR is generated in the inside of the resonance unit 2 and that the virtual reference potential VRPR coincides with the reference potential TRP of the resonance unit 2 when the phase shift amount phi is zero degrees. This concept of the virtual reference potential will be later used again to explain "an unbalanced circuit" of the resonance unit 2.

Then, the expression (1) will be transformed and the following expression is obtained.

$$e_2 - e_1 = B \sin \omega t \cdot \cos \phi$$

[Expression 3]

Here, B is a coefficient uniquely determined by the configuration of the resonance unit 2 and has frequency characteristics.

The expression (3) means that when a control phase amount phi is zero degrees, no current flows through the impedance ZK of the resonance unit 2. Thus, all the currents passed through the terminal T11 is fed into the terminal T12 and the value is (e11−e12)/(Z11+Z12). All the currents flowed into the terminal T21 is fed into the terminal T22 and the value is (e21−e22)/(Z21+Z22).

Next, particularly when the impedances Z11, Z12, Z21, and Z22 of a serial branch of FIG. 4 are all equal to one another, an absolute value e0 of an applied voltage is set to be equal, then the expression becomes very simple as follows:

$$e_2 - e_1 = 2e_0 \sin \omega t \cdot \cos \phi$$

[Expression 4]

Figure 5:
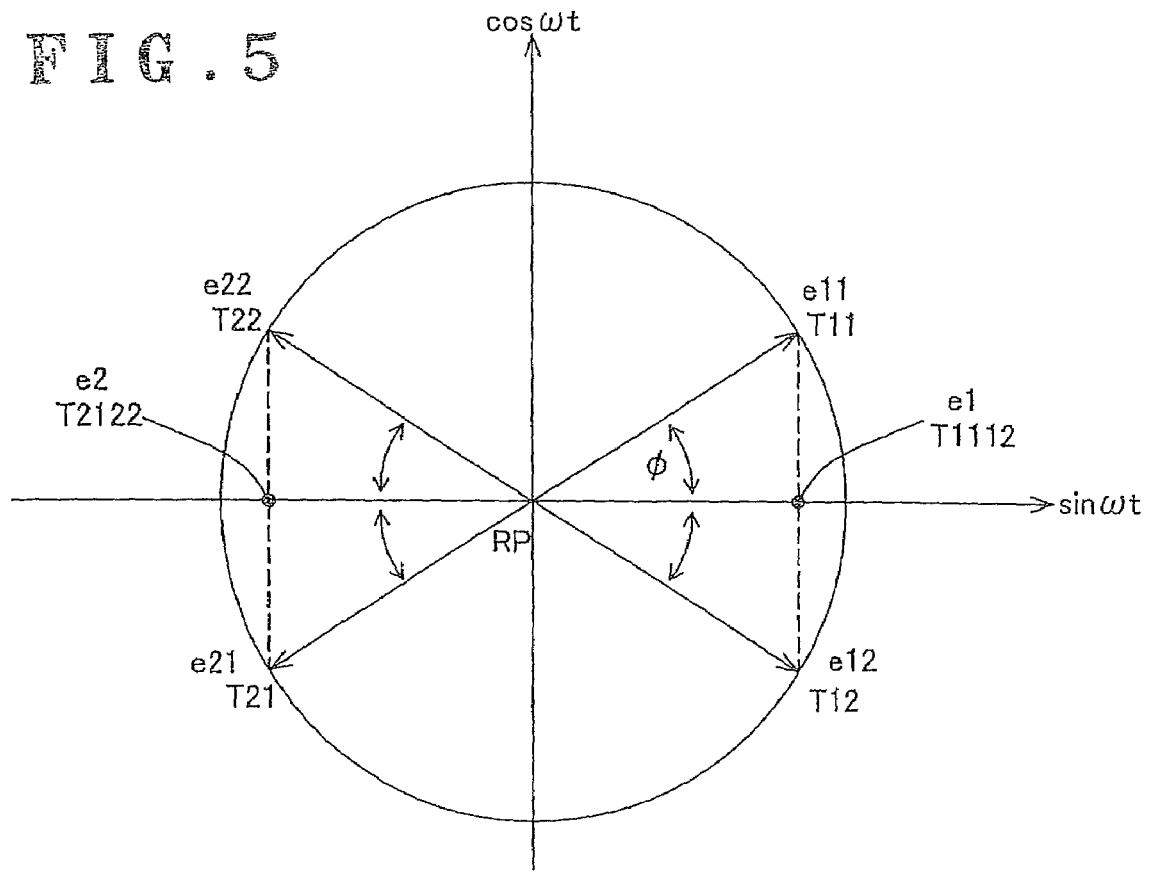
FIG. 5 illustrates the function using a vector diagram.

The value on the left side of the expression (4) varies from −1 through 0 to +1 depending on a value of a control phase amount phi. However, the discussion will go on based on the assumption that the absolute value e0 of the applied voltage is 1. More specifically, the current flowing into the impedance ZK of FIG. 4 varies from advance to zero from zero to delay. This relationship is shown in FIG. 5. The point of origin in FIG. 5 is where the virtual reference potential is zero. The horizontal axis shows a phase that is the same as that of a voltage applied to the input terminal TS. The vertical axis shows a phase that has a phase difference of 90 degrees with respect to the phase of the applied voltage. By changing the control phase amount phi, a potential difference between the terminals T1112 and T2122 of FIG. 4 can be varied continuously and even brought to zero. This means that in FIG. 4 a current flowing through the impedance ZK can be arbitrary varied by changing a control phase amount phi of the externally applied voltages e11, e12, e21, and e22. By changing a control phase amount phi, the complex resonance circuit behaves as if the fixed value of the impedance ZK has equivalently varied.

This means nothing other than construction of a complex quantity electronic volume or an electronic switch. That is, in the frequency concerned, if the impedance ZK of FIG. 4 is configured, for example, of an element with inductance, a complex quantity electronic volume that continuously varies an inductance value will be configured. If the impedance ZK is configured of an element with capacitance, a complex quantity electronic volume that continuously varies a capacitance value will be configured. If the impedance ZK is configured of an element with resistance, a complex quantity electronic volume that continuously varies a resistance value will be configured.

It is a current that plays a leading part here. Thus, the above effects are produced if the four phase differences almost exactly have the relationship of phi, minus phi, pi plus phi, and pi minus phi, and the relationships e11/Z11 equals to e12/Z12 and e21/Z21 equals to e22/Z22 are satisfied. In a case where e11/Z11 does not equal to e12/Z12 and slightly differs, and where e12/Z12 does not equal to e22/Z22 and slightly differs, the above effects can also be obtained if phase differences are slightly changed from the relationship of phi, minus phi, pi plus phi, and pi minus phi.

Furthermore, four phase relationships, i.e., the relationship of phase differences phi, minus phi, pi plus phi, and pi minus phi, can be obtained by obtaining two phase relationships, i.e., the relationship of phase differences phi and minus phi, and combining each with an inverting amplifier.

Thus far, it has been explained that the complex resonance circuit of the present invention functions as a complex quantity electronic volume capable of continuously controlling a range from the impedance ZK to open (infinite), and that the complex resonance circuit works as an electronic switch when open (infinite).

Figure 6:
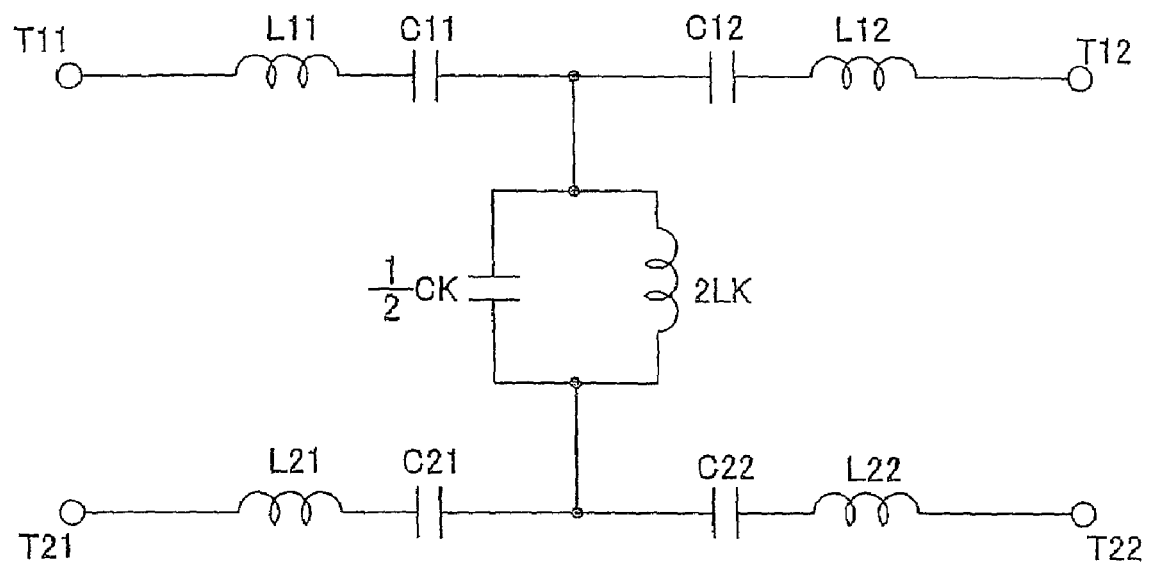
FIG. 6 shows a configuration of a T-shaped terminal type ladder circuit wherein respective branches are made up of resonance circuits.

Next, the principles of varying a frequency will be described. For the sake of explanation, only the resonance unit 2 of the complex resonance circuit 1 will be presented again in FIG. 6 with symbols assigned thereto. When the respective impedances of the resonance unit 2 of FIG. 6 are configured of elements having resonance characteristics, the resonance frequency can be varied by changing a control phase amount phi.

Respective inductance values connected in series are designated as L11, L12, L21, and L22, respective capacitance values thereof as C11, C12, C21, and C22, an inductance value connected in parallel as 2xLK, and a capacitance value thereof as CK/2. In FIG. 6 loss will be ignored. This will not cause any problem in examining the subject matter under consideration. To explain the essence of the present invention, it is assumed that all the inductances connected in series have an equal value LS, and similarly, an equal value capacitance value CS.

The impedances Z11, Z12, Z21, and Z22 have both of inductance and capacitance. The impedance ZK, on the other hand, may be configured only of inductance or capacitance, or both of the two. Also, the impedance ZK may be embodied by using two terminals of a multiple terminal network. Thus, the explanation will be continued assuming that only an element having capacitance is connected. Assume that a capacitance value of this element is CK/2.

In such a circuit configuration, when a frequency of the frequency variable reference signal generator 8 is varied, a maximum value appears in a current passing through, for example, the terminal T11 of the resonance unit 2. This phenomenon of appearance of the maximum value also occurs in the terminals T12, T21, and T22 simultaneously. A frequency that gives a maximum value of a current, i.e., a resonance frequency FR, can be obtained by the following expression on condition that an impedance is found, with reference to FIG. 5 and in view of imaginary part of the voltage, from total currents generated by a voltage caused by both of real and imaginary parts, and that the imaginary part is zero.

$$Fr = \frac{1}{2\pi}\sqrt{\frac{1 + 2\frac{Cs}{Ck}\sin^2\phi}{LsCs}}$$ [Expression 5]

From the expression 5 it is understood that the resonance frequency can be varied by varying the control phase amount phi. A frequency can be continuously varied between a frequency F0, which is a frequency when the control phase amount phi is zero degrees, and a frequency F90, which is a frequency when the control phase amount phi is 90 degrees. When a value of CS/CK is small in the expression (5), an expression (6) may be used instead.

$$Fr = \frac{1}{(2\pi)\sqrt{LsCs\left(1 - 2\frac{Cs}{Ck}\sin^2\phi\right)}}$$ [Expression 6]

It should be noted that no new loss is generated in the process discussed above. Conversely, focusing on a real part of the impedance, the impedance sometimes shows negative resistance when the control phase amount is at a midpoint between zero and 90 degrees. This bears out our discussion which has ignored the loss. This further means that a Q-value does not deteriorate in an entire frequency variable band. Namely, the present invention can generate a high purity signal whose frequency is variable.

Numerical calculation of a behavior of the expression (5) is shown in FIG. 3. The horizontal axis shows control phase amounts phi. The vertical axis shows values of the resonance frequency FR, where the values are standardized with F0 as 0 and F90 as 1. When a control phase amount phi of FIG. 3 is in the proximity of zero or 90 degrees, the standardization resonance frequency on the vertical axis indicates an extreme value. This means that the respective control phase amounts phi in the respective voltages e11, e12, e21, and e22 that are applied to the terminals T11, T12, T21, and T22 produce effects similar to an ideal control phase amount even if the respective control phase amounts phi slightly deviate from the ideal control phase amount.

Next, the functions of the resonance output circuit 4 and the phase shift circuit 5 will be explained referring to FIG. 1.

The complex resonance circuit 1 has, as already explained, the following function: When the frequency variable reference signal generator 8 is connected to the complex resonance circuit 1, maximum values appear simultaneously in currents passing through the terminals T11, T12, T21, and T22 of the resonance unit 2. By varying the control phase amount phi, it becomes possible to continuously vary a frequency that gives the maximum value of the current within a predetermined frequency range. Since the maximum value of the current appears at any of the four terminals T11, T12, T21, and T22, it is sufficient to use at least any one of these four terminals. Thus, in FIG. 1, a resonance current passing through the terminal T11 will be detected.

To detect a resonance current, a detecting impedance ZDET should be inserted between the terminals T1 and T11 and a voltage difference across the impedance should be read using a differential amplifier AMP1.

Next, the phase shift circuit 5 will be described. The phase shift circuit 5 has a function of phase compensation to adjust a reference of a phase of a resonance current obtained in the resonance circuit 4 to a reference of a phase of the input terminal TS. That is, since a phase of a current flowing through the terminal T11 is shifted by a control phase amount phi from a phase of a voltage applied to the input terminal TS, the shifted amount is compensated to produce resonance current information easy to handle. The phase shift circuit 5 performs phase compensation on output information obtained by the current detecting unit such that a phase is shifted to a reverse direction by the amount shifted by the control phase amount phi. In this manner, the reference of the phase of the output terminal TL and the reference of the phase of an output from the frequency variable reference signal generator 8 are made to coincide. Please note, however, that it is assumed that nonessential phase shift has been compensated by a conventional phase compensation unit.

Figure 2:
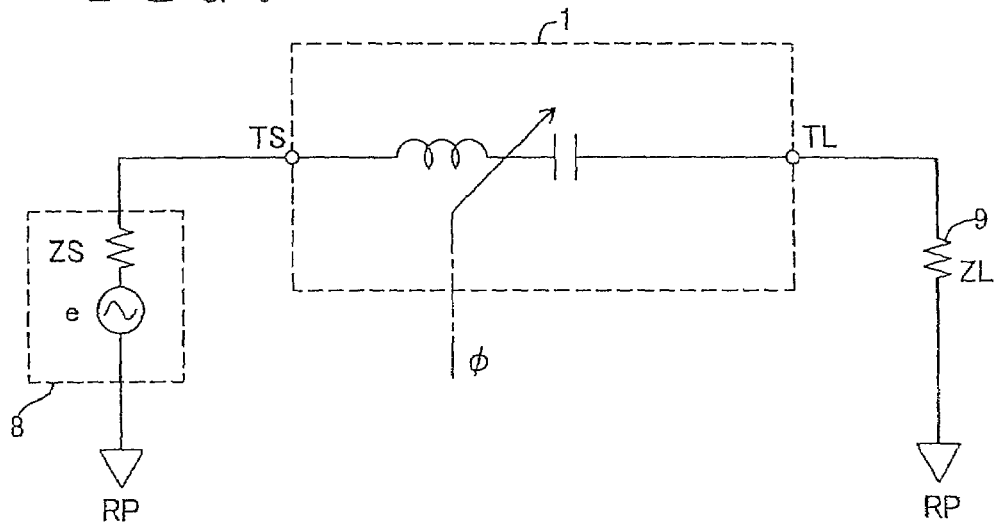
FIG. 2 conceptually illustrates effects of the complex resonance circuit 1.

Due to the phase compensation by the phase shift circuit 5, the circuit of FIG. 1 operates in a manner closely analogous to the circuit of FIG. 2. Thus, an easy-to-use circuit is provided.

Figure 7:
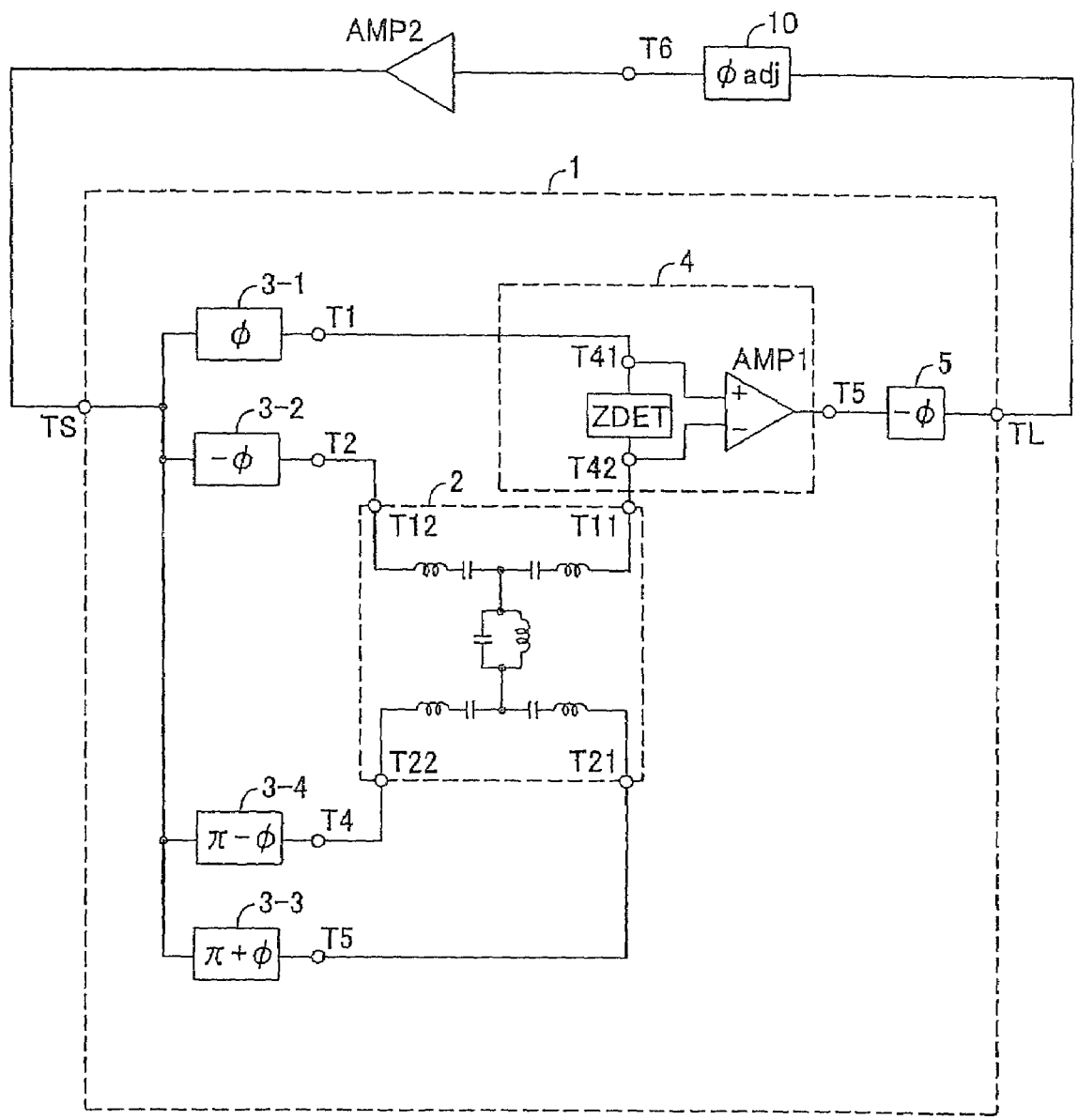
FIG. 7 shows a configuration of an embodiment of a oscillator circuit.

Embodiment 2, which is an oscillator configured of the complex resonance circuit 1 of the present invention, will be described referring to FIG. 7. An oscillator circuit shown in FIG. 7 is composed of the input terminal TS and the output terminal TL of the complex resonance circuit 1 shown in FIG. 1, and a cascade connected circuit made up of an amplifier AMP2 and a phase shift circuit 10. Input and output terminals of the cascade connected circuit are connected to the input terminal TS and the output terminal TL of the complex resonance circuit 1.

A function of the amplifier AMP2 is set such that a loop gain of one round oscillation loop which makes the oscillator works satisfies amplitude and phase conditions.

Regarding the amplitude conditions, an amplification factor of the amplifier AMP2 is set such that the loop gain exceeds 1 while satisfying the phase conditions. Such setting can be made by conventional technologies. Regarding the phase conditions, a phase rotation amount of the loop should be an integer multiple of 2 pi. Thus, the condition that the phase rotation amount should be an integer multiple of 2 pi may be satisfied by appropriately setting a phase shift amount of the phase shift circuit 10.

In this complex resonance circuit, too, it is possible to vary a frequency as much as in conventional techniques by varying the phase shift amount of the phase shift circuit 10. Thus, this complex resonance circuit can be also used to adjust initial deviations of the frequency of the resonance unit 2 to a target frequency or to modulate signals.

The complex resonance circuit 1 explained thus far is composed of the resonance unit 2 having the four terminals, the four phase shift circuits 3-1, 3-2, 3-3, and 3-4, the resonance output circuit 4, and the phase shift circuit 5. Then, it will be explained based on Embodiment 3 shown in FIG. 8 that the object of the present invention can be achieved by a complex resonance circuit 1 having a simpler configuration.

Figure 8:
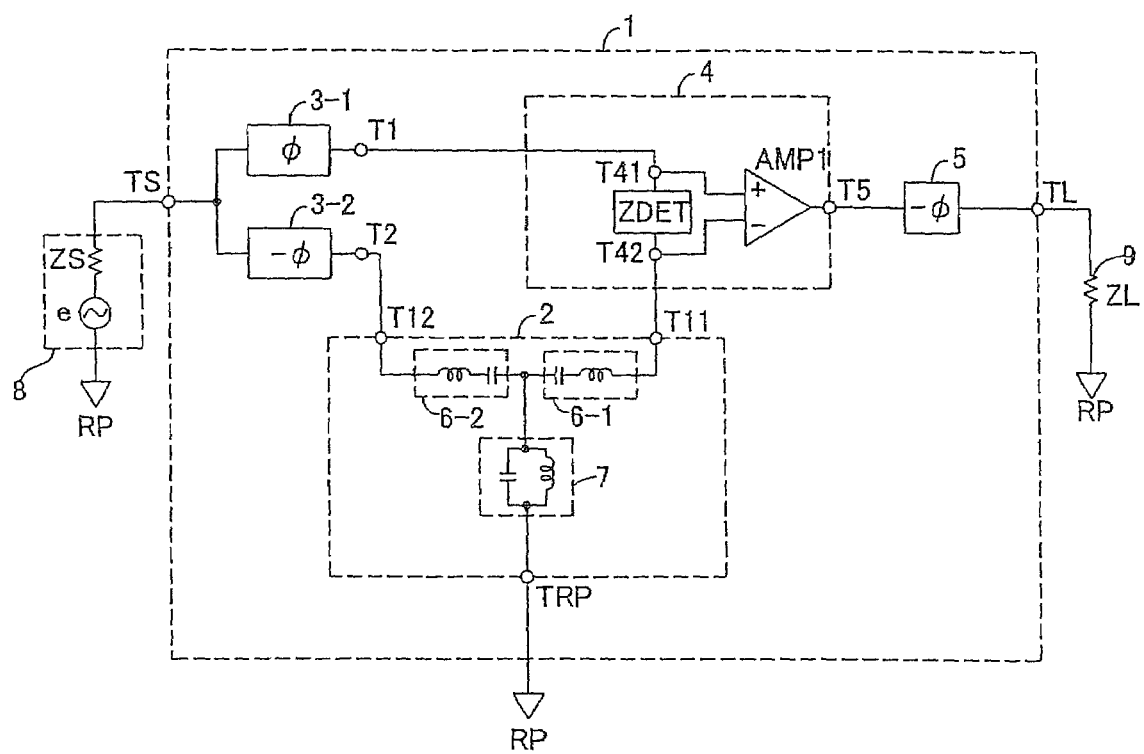
FIG. 8 shows a configuration of an embodiment of an unbalanced T-shaped terminal type ladder circuit.

The configuration is shown in FIG. 8. This complex resonance circuit 1 is composed of a resonance unit 2 having three terminals, two phase shift circuits 3-1 and 3-2, a resonance output circuit 4, and a phase shift circuit 5.

The resonance unit 2 is expressed as an unbalanced ladder lumped-parameter equivalent circuit. Considering that the resonance unit 2 in FIG. 1 is a balanced ladder lumped-parameter equivalent circuit, the differences can be clearly grasped.

This complex resonance circuit 1 is made up of the following constituent elements: an input terminal TS; an output terminal TL; reference terminals RP; a resonance unit 2 having a first terminal T11, a second terminal T12, and a reference terminal TRP; two phase shift circuits 3-1 and 3-2 that are connected between the first and second terminals T11 and T12, and the input terminal, and respectively shift phases so that the phases are reverse to each other; and a resonance output circuit 4 that supplies a resonance output corresponding to magnitude of a current issued from either of the phase shift circuits. The resonance unit 2 is a complex resonance circuit including the following constituent elements: at least a pair of serial resonance characteristic elements which are connected between the first and second terminals, and respective one end of which is connected at a midpoint therebetween, and which exhibit resonance frequencies substantially equal to each other; and a reactance circuit connected between the midpoint and the reference terminal.

More specifically, The complex resonance circuit 1 is a complex resonance circuit composed of an input terminal TS; an output terminal TL; reference terminals RP; a resonance unit 2 having a first terminal T11 and a second terminal T12; a phase shift circuit 3-1 that is connected between the input terminal TS and the terminal T1, and shifts a phase by phi; a resonance output circuit 4 whose input terminals T41 and T42 are connected between the terminal T1 and the first terminal T11 of the resonance unit 2 and whose output terminal is connected to the terminal T5; a phase shift circuit 5 connected between the terminal T5 and the output terminal TL; a phase shift circuit 3-2 connected between the input terminal TS and the second terminal T12 of the resonance unit 2 and shifts a phase by minus phi. The resonance unit 2 includes at least a pair of serial resonance characteristic elements 6-1 and 6-2 which are connected between the first and second terminals, respective one end of which is connected at a midpoint therebetween, and which exhibit resonance frequencies substantially equal to each other; and a reactance circuit 7 connected between the midpoint and the reference terminal.

Next, operation of the complex resonance circuit 1 will be described. A frequency variable reference signal generator 8 is connected between the input terminal TS and the reference terminal RP of the complex resonance circuit 1. A load ZL is connected between the output terminal TL and the reference terminal RP.

When an output frequency of the frequency variable reference signal generator 8 is varied with a control phase amount phi, which characterizes phase shift amounts of the two phase shift circuits 3-1 and 3-2, being fixed at a given value, let's say at phi 1, a maximum current flows through the load ZL when the frequency is FR1. In this phenomenon, the complex resonance circuit 1 acts like a series circuit of an inductance element and capacitance element as roughly shown in FIG. 2. When the control phase amount phi is changed to phi 2, a maximum current flows through the load ZL at a frequency FR2, which is different from the frequency FR1. When the control phase amount phi is continuously varied, a frequency that gives a maximum value can be also continuously varied.

Where a resonance frequency of a phase shift amount phi at zero degrees is F0 and a resonance frequency of the phase shift amount phi at ninety degrees is F90, when the phase shift amount phi is shifted within the range of zero to ninety degrees, frequencies within the band of these two frequencies become continuously sweepable. In other words, this resonance frequency FR is arbitrarily variable within a predetermined band by controlling the control phase amount phi. FIG. 3 quantitatively illustrates a relationship between the control phase amount phi and the resonance frequency FR. The horizontal axis shows the control phase amount phi. The vertical axis shows a value of the resonance frequency FR where values are standardized with F0 as zero and F90 as one.

Since these two frequencies F0 and F90 are determined by circuit constants of the resonance unit 2, these frequencies can be set arbitrary within a given band.

Especially when the resonance unit 2 is configured of a piezoelectric device, which is a distributed constant device, a frequency difference between these two frequencies can be set beyond the limits of the electromechanical coupling factor. That is, the feature of the present invention is that frequencies can be continuously varied beyond the limits of the electromechanical coupling factor, which is a characteristic of piezoelectric devices. This is what the present invention has pioneered.

Next, the principles of continuously varying a frequency will be described. It has already been explained that a frequency can be varied by a control phase amount phi in the complex resonance circuit of FIG. 1 where the resonance unit 2 is used. Compared with the configuration shown in FIG. 1, a configuration of FIG. 8 includes only two phase shift circuits in the complex resonance circuit 1, which is only half as many phase shift circuits as the configuration of FIG. 1 has. Furthermore, compared with the resonance unit 2 of FIG. 1, a resonance unit 2 of FIG. 8 is characterized by having approximately half as many constituent elements as the resonance unit 2 of FIG. 1.

The principle for performing a same function with approximately half as many constituent elements is that a virtual reference potential appears in the resonance unit 2 having four terminals T11, T12, T21 and T22 when a control phase amount phi is zero. It has already been stated that the virtual reference potential VRPR is generated inside of the resonance unit 2 and that the virtual reference potential VRPR coincides with a reference potential TRP of the resonator when the control phase amount phi is zero degrees. Thus, the reference potential TRP can be provided by an external terminal RP.

Focusing on this virtual reference potential, it can be pointed out that this complex resonance circuit is characterized by being twofold symmetric with respect to the virtual reference potential (point).

Hence, if it is possible to provide the virtual reference potential by an external terminal in the configuration of the resonance unit 2, an actual reference potential TRP can be set to be this virtual reference potential in the resonance unit 2. Thus, if the actual reference potential TRP is connected to a reference potential RP of the entire complex resonance circuit 1, only two phase shift circuits suffices, which is half as many as in FIG. 1.

In the manner described above, the resonance unit 2 shown in FIG. 1 can be configured as an unbalanced circuit. To be concrete, the resonance unit 2 will be as shown in FIG. 8. Values of equivalent constants of the resonance unit 2 of FIG. 1 are given in FIG. 6. The resonance unit 2 of FIG. 8 is characterized in that the values of the equivalent constants thereof are capacitance CK and inductance LK, whereas the values of the equivalent constants of the reactance circuit 7 of FIG. 6 are capacitance CK/2 and inductance 2×LK. The resonance unit 2 of FIG. 8 is also characterized by having three external terminals T11, T12, and TRP.

Thus far, the resonance unit 2 has been explained taking as an example a so-called "ladder circuit" shown in FIG. 4, wherein the impedances Z11, Z12, Z21, and Z22 are respectively connected to the terminals T11, T12, T21, and T22. However, a circuit structure of the resonance unit 2 of the present invention is not limited thereto. The resonance unit 2 may be configured of a circuit equivalent thereto such as "a lattice circuit" in accordance with a circuit network theory. FIG. 9 shows examples of other circuit structures, which constitute a part of the present invention.

FIG. 9(a) shows a circuit that corresponds to the resonance unit 2 of FIG. 4, FIG. 9(b) a circuit that corresponds to the resonance unit 2 of FIG. 6, FIG. 9(c) a circuit wherein the respective branches of FIG. 9(a) are configured of piezoelectric resonators, and FIG. 9(d) a circuit of FIG. 9(b) to both ends of which capacitances are added.

The meaning of the relationship between FIGS. 9(d) and 9(b) is as follows: In FIG. 4, the discussion was carried out designating voltages applied to the terminals T11, T12, T21 and T22 as e11, e12, e21, and e22. In this case, even a capacitance Cd1 is connected between the terminal T11 and T21 of the circuit of FIG. 9(b) and a capacitance Cd2 between the terminal T12 and T22, as in the circuit of FIG. 9(d), a phenomenon and effects same as FIG. 9(b) are produced. On the other hand, according to a circuit network theory, when respective branches are configured of piezoelectric vibrators as in the circuit of FIG. 9(c), there are cases where it is possible to extract parallel capacitance of the piezoelectric vibrators and convert a circuit into a circuit as shown in FIG. (d). In such a case, the resonance unit 2 is not affected by parallel capacitance which is characteristic of piezoelectric vibrators. This means that continuously variable characteristics are obtained within a band of arbitrary set two characteristic frequencies.

The resonance unit 2 of the present invention may be configured of a circuit structure of FIG. 9(e). FIG. 9(e) is a pi-shaped terminal type whereas the circuit of FIG. 4, which is also a balanced ladder circuit, is a T-shaped terminal type.

As representative examples are shown in FIG. 10, the resonance unit 2 of the present invention may be configured, for example, of cascade connected resonance units 2 of FIG. 1 or FIG. 8. FIG. 10(a) is an example of ladder resonance element circuits, and FIG. 10(b) lattice resonance element circuits.

In this case, a control range of a control phase amount phi needs to be expanded depending on a number of stages m of the cascade connection.

The resonance unit 2 discussed so far is either a balanced ladder lumped-parameter equivalent circuit shown in FIG. 1 or an unbalanced ladder lumped-parameter equivalent circuit shown in FIG. 8. A requirement for the resonance unit 2 is that the resonance unit 2 has at least two serial resonance characteristic elements whose resonance frequencies are substantially equal to each other, and a reactance circuit connected therebetween.

The resonance unit 2 may be, however, configured of devices of any structure as long as the resonance unit 2 can be substantially expressed as a lumped-parameter equivalent circuit. Namely, the lumped-parameter equivalent circuit may be configured of a distributed constant device equivalent thereto.

In the case of a distributed constant device, there are no special limits in various vibration modes internally generated, and thus, the resonance unit 2 can be applied widely to this type of devices. Namely, the resonance unit 2 is applicable to all the devices that utilize various resonance phenomena in a distributed constant circuit (three-dimensional circuit), more specifically, to any devices that utilize solid ultrasonic vibrations, electromagnetic vibrations in the broad sense of the word, fluidic ultrasonic vibrations, and the like. Hence, the resonance unit 2 can be applied, for example, to any devices that utilize resonance of low frequencies such as the voice band in air, ultrasonic frequencies of a solid body, frequencies of electromagnetic waves, and frequencies of light.

Connecting means of a distributed constant device to be connected with electric terminals, i.e., energy transfer means that transfers internal energy via the electric terminals, may use any of transducing mechanisms such as piezoelectric, static, magnetic, and electromagnetic transducers.

A concrete configuration of the distributed constant device is as follows: A resonance unit includes a distributed constant circuit exhibiting at least two natural resonances. The distributed constant circuit has at least two transfer means to be connected to the natural resonances and transfer electric energy.

Alternatively, the configuration of the distributed constant device can be expressed as follows: A resonance unit includes at least three electric terminals that electrically connect internal energy and each of at least two resonances connected with each other.

To give detailed explanation of the configuration of the resonance unit 2 as a distributed constant device, the same symbols are used for designating terminals of the resonance unit 2 as in the resonance unit 2 of Embodiment 1 (FIG. 1) or Embodiment 3 (FIG. 8). Thus, when the respective terminals of the resonance unit 2 are connected in a similar way, the complex resonance circuit as a whole operates in the same way as in Embodiment 1 (FIG. 1) or Embodiment 3 (FIG. 8). Therefore, the configuration and operation of the resonance unit 2 itself will be described hereinafterbelow.

Examples of the configuration of a distributed constant device will be given without separating a balanced and unbalanced type.

Embodiment 4, wherein the resonance unit 2 is configured of piezoelectric resonators, will be described referring to FIG. 11. FIG. 11(a) is an example where a distributed constant device is configured of piezoelectric vibrators and has a balanced structure. In this configuration, at least a pair electrodes 12-1 and 12-2 respectively connected to terminals T11 and T21, and at least a pair electrodes 13-1 and 13-2 respectively connected to terminals T12 and T22 are provided on major surfaces of a piezoelectric plate 11. FIG. 11(b) is a configuration wherein the terminals T21 and T22 of FIG. 11(a) are respectively connected to a terminal TRP. FIG. 11(c) is a configuration wherein the electrodes 12-2 and 13-2 of FIG. 11(a) are joined on the piezoelectric plate and connected to the terminal TRP. In FIG. 11(d), at least electrodes 12-1 and 12-2, 13-1 and 13-2, and 15-1 and 15-2 are provided on both of the major surfaces of the piezoelectric plate such that these electrodes face each other. The electrode 12-1 is connected to the external terminal T11, the electrode 12-2 to the external terminal T21, the electrode 13-1 to the external terminal T12, the electrode 13-2 to the external terminal T22, and electrodes 15-1 and 15-2 are connected to each other so as to have a same potential. Although only three pairs of opposing electrodes are shown in the figure, the number of the pairs may be three or more. Since the relationship between observed frequencies of the electrode pairs on both ends and the frequencies of the respective opposing areas is disclosed in prior art, the frequencies of the areas where the electrodes are opposing are preliminarily adjusted to be substantially the same frequencies. Or both of the electrodes 12-2 and 13-2 may be connected to the terminal TRP. FIG. 11(e) shows an example of a surface acoustic wave resonator, wherein excitation electrodes are configured of interdigital electrodes. In this configuration, at least two sets of electrode pairs are provided on a major surface of a piezoelectric plate 11: The two sets of electrode pairs are at least a pair of electrodes 12-1 and 12-2 respectively connected to the terminals T11 and T21, and at least a pair of electrodes 13-1 and 13-2 respectively connected to the terminals T12 and T22. FIG. 11(f) is an example of a Solid Mounted Resonator (SMR) vibrator. On a major surface of a substrate 17, a multiple film layer 16 for reflecting acoustic wave, a lower electrode 14, a piezoelectric thin film 11 are provided. Segmented electrodes 12-1 and 13-1 are placed side by side thereon. The lower electrode 14 is connected to a terminal TRP, the segmented electrode 12-1 to a terminal T11, and the segmented electrode 13-1 to a terminal T12. The piezoelectric thin film 11 is configured, for example, of ZnO.

An example shown in FIG. 12 as Embodiment 5 belongs to a category called silicon MEMS resonators. In this example, a resonator unit 2 also belongs to elecromechanical resonators, but coupling effect of electrical and mechanical vibrations is implemented by an electrostatic coupling phenomenon.

To bring about an electrostatic coupling phenomenon, a phenomenon as follows is utilized: When voltages of same polarity are applied across a pair of electrodes which are spaced from each other, repulsive force is generated therebetween, and when voltages of different polarity are applied thereto, attraction force is generated therebetween. Electrostatic drive means utilizing this phenomenon can drive mechanical vibrations of a silicon beam vibrator. In this electrostatic drive means, the silicon beam vibrator is vibrated by generating repulsive and/or attraction force between electrodes disposed on the silicon beam vibrator and a group of electrodes on an inner wall spaced therefrom.

As shown in FIG. 12, this vibrator is composed of a silicon beam vibrator 18 and a group of electrodes 19 on inner walls. The silicon beam vibrator 18 has an electrode group arranged on surfaces thereof. In a central part of the vibrator, the beam vibrator 18 is arranged, and the group of electrodes 19 on the inner walls, each of which is separated, is arranged so as not to contact with the beam vibrator. To utilize the electrostatic coupling phenomenon, the electrode group arranged on the beam vibrator 18, the group of electrodes on the inner wall, and electric terminal T11, T12, and TRP are connected via signal pattern converters 20-1 and 20-2.

Thus, the resonance unit, which further includes the electrostatic drive means and the signal pattern converters, has the terminals T11, T12, and TRP, and realizes a resonance unit of the present invention in MEMS devices.

A structure of the beam vibrator 18 is shown in FIG. 12(a). The beam vibrator 18 is a bar-shaped silicon vibrator. The vibrating beam has a substantially square cross-section. At a portion having a total length of 0.224, a pair of wires W12BP and W11BN and another pair of wires W12BP and W12BN, to which voltages are applied, are disposed on planes perpendicular to each other to support the beam vibrator. On the surfaces on which wires W11BP, W11BN, W12BP, and W12BN are arranged, electrodes E11BP, E11BN, E12BP, and E12BN, which are connected to the respective wires, are provided on respective surfaces of the bar to form opposing areas with electrodes arranged on opposing surfaces. When necessary, for example, to adjust a frequency variable band, edges of the silicon beam vibrator 18 should be partially cut off by a proper amount.

The placement relationship between the beam vibrator 18 and the group of electrodes 19 on the inner walls is illustrated in FIG. 12 (b) with a cross-section of a central part of the beam vibrator 18 shown. Electrodes E11DP, E11DN, E12DP, and E12DN are provided on respective inner walls of a silicon block which is hollowed out in a square shape.

FIG. 12(c) shows a cross-section of the central part of the beam vibrator in a longitudinal direction. A relative placement relationship between the beam vibrator 18 and the electrodes thereon, and the group of electrodes 19 on the inner walls will be explained. As shown in FIG. 8(c), two sets of four electrodes, i.e., a set of four electrodes of E11BP, E11BN, E12BP and E12BN; and another set of four electrodes of E11DP, E11DN, E12DP and E12DN, face one another with space in between. When, for example, electropositive potentials are applied to both of the electrodes E11BP and E11DP at a certain moment, repulsive force acts between these two electrodes. If at the same time a positive (+) electric potential is also applied to the electrode E11BN and a negative (−) electric potential to the electrode E11DN, then, attraction force acts between these electrodes. By such a push-pull operation, the central part of the beam vibrator 18 is displaced to a direction of the electrode E11DN. Since the beam vibrator 18 is supported by the wires at the portion having the beam length of 0.224, the beam vibrations efficiently excite flexure displacements. The same holds true for other pairs of electrodes.

Next, referring to FIG. 12(d), a relationship between two sets of four electrodes, i.e., a set of four electrodes of E11BP, E11BN, E12BP and E12BN; and another set of four electrodes of E11DP, E11DN, E12DP and E12DN, and the terminals T11, T12, and TRP of the resonance unit 2 will be described. The four electrodes of E11BP, E11BN, E11BP and E11BN are connected to the terminals T11 and TRP via the signal pattern converter 20-1. The four electrodes of E12DP, E12DN, E12DP and E12DN are connected to the terminals T12 and TRP via the signal pattern converter 20-2.

The signal pattern converters 20-1 and 20-2 have a same function, and thus, an explanation will be made only for the signal pattern converters 20-1. The signal pattern converters 20-1 has terminals to be connected to the terminal T11 and the four electrodes E11DP, E11BP, E11DN, and E11BN. Regarding a correlationship among signal patterns, the signal pattern converters 20-1 has the following function: providing to the electrodes E11DP, E11BP, E11DN, and E11BN outputs of electropositive, electropositive, electropositive, and electronegative in the order of these electrodes, when power applied to the terminal T11 has an electropositive phase; and providing to the electrodes E11DP, E11BP, E11DN, and E11BN outputs of electronegative, electropositive, electropositive, and electropositive, in the order of these electrodes, when oscillations applied to the terminal T11 has an electronegative phase. The same holds true for the signal pattern converters 20-2. It is effective to set an output impedance of these signal pattern converters low to prevent accumulation of electric charges on the silicon beam vibrator.

In this manner, the silicon beam vibrator can be driven by applying a drive power to the terminals T11, T12, and TRP.

A value of capacitance between the opposing electrodes varies as the silicon beam vibrator vibrates. This means that a value of an electric current corresponding to a voltage applied to the opposing electrodes, i.e., admittance varies with the vibrations of the silicon beam vibrator. Hence, it is also possible to provide the signal pattern converters with a function to detect the changes of the admittance, detect the vibrating state of the silicon beam vibrator, and use this to efficiently excite sinusoidal vibrations. Here, connection to the terminals T11, T12, and TRP can be made by a converter similar to the drive system of prior art.

Instead, further adding another pair of opposing electrodes and disposing one electrode of the pair on the silicon beam vibrator, and the other on an internal wall, means to directly detect an amount of capacitance between this electrode pair may be used.

In FIG. 13, an example of a configuration of a resonance unit having a stripline as an electromagnetic resonator will be shown as Embodiment 6.

FIG. 13(a) shows an example of a stripline resonance unit of an unbalanced T-shaped ladder resonance circuit. A stripline 22-1 is provided on a substrate 21. Both ends of the stripline 22-1 are connected to terminals T11 and T12. A stripline 22-2 is connected at a central part of the stripline 22-1. The other end of the stripline 22-2 is connected to a terminal TRP. By selecting lengths of these two striplines, a frequency variable band can be arbitrary set.

FIG. 13(b) shows an example of a stripline resonance unit of a balanced T-shaped ladder resonance circuit. On a substrate 21, a stripline 22-1 is provided. Both ends of the stripline 22-1 are connected to terminals T11 and T12. A central part of the stripline 22-1 and a stripline 22-3 are provided. Both ends of the stripline 22-3 are connected to terminals T21 and T22. Both ends of the stripline 22-2 are connected to a central part of the striplines 22-1 and the striplines 22-3. By selecting lengths of the three striplines, a frequency variable band can be arbitrary set.

FIG. 13(c) shows an example of a stripline resonance unit of a balanced pi-shaped ladder resonance circuit. On a substrate 21, a stripline 22-1 and a stripline 22-3 are provided. Both ends of the stripline 22-1 are connected to terminals T11 and T12. Both ends of the stripline 22-3 are connected to terminals T21 and T22. Both ends of a stripline 22-2 are connected in proximity of the end of the stripline 22-1 connected to the terminal T11, and in proximity of the end of the stripline 22-3 connected to the terminal T21. Both ends of a stripline 22-4 are connected in proximity of the end of the stripline 22-1 connected to the terminal T12, and in proximity of the end of the stripline 22-3 connected to the terminal T22. By selecting lengths of the four striplines, a frequency variable band can be arbitrary set.

FIG. 13(d) shows an example of a stripline resonance unit of a balanced T-shaped ladder resonance circuit. On a substrate 21, a stripline 22-1 and a stripline 22-3 are provided. Both ends of the stripline 22-1 are connected to terminals T11 and T12. Both ends of the stripline 22-3 are connected to terminals T21 and T22. A stipline 22-2 is provided in an intermediate area between central parts of the striplines 22-1 and 22-3 with space in between. By selecting lengths of the three striplines and the spacing, a frequency variable band can be arbitrary set. The stipline 22-2 may be a dielectric resonator that functions in various resonance modes.

An example of the application of the present invention to a transducer will be described. A transducer is a device that has an energy transduction action of transducing electric energy to/from desired energy. To implement this energy transfer function, a complex resonance circuit is configured of a resonance unit 2-1 that conducts energy transfer. These transducers are generally reversible circuits. However, in the explanation hereiafterbelow, an explanation will be given only for one direction wherein electric energy is fed and another desired energy is obtained.

To send the another desired energy to the exterior of the resonance unit 2-1, the resonance unit 2-1 should have an exposed structure exposed to space into which the energy should be sent so that the energy can be sent out at least from a part of the resonance unit 2-1.

The exposed structure will be described. First, a completely-reflective outer wall structure will be explained. To give the resonance unit a structure wherein energy transfer to the exterior does not occur, a medium vibrating in the interior of the resonance unit should be enclosed with an outer wall. In this structure, the outer wall functions as a surface to completely reflect energy flowing out to the exterior from the medium vibrating in the interior, or a surface to completely block the energy and prevent its leakage to the exterior. By employing such a structure, a high-performance resonance unit having advantages such as not affected by the exterior can be obtained. A resonance unit used for a frequency oscillator and the like has this structure.

On the other hand, to make a resonance unit serve as a transducer, the resonance unit employs a structure wherein a part of energy flowing out to the exterior from the medium vibrating in the resonance unit is allowed to flow out to the exterior. This structure is defined as an exposed structure. An opening may be formed in a part of an outer wall, or the opening may be sealed up with a material that does not completely reflect the energy. Alternatively, the energy may be reflected incompletely.

The resonance unit 2-1 may be configured either of a balanced resonance unit having four terminals or an unbalanced resonance unit having three terminals.

Basically, the resonance output circuit 4, the phase shift circuit 5 for phase compensation, and the output terminal TL, all of which were included in the complex resonance circuit 1 of Embodiments 1 and 3, are not necessary.

Embodiments will be described in the following order: In Embodiment 7, a case where ultrasonic energy is transferred as external energy will be illustrated as an example of a balanced resonance unit. Next, in Embodiment 8, as an example of an unbalanced resonance unit, a case where ultrasonic energy is transferred as external energy will be described. Then, in Embodiment 9, a case where electromagnetic wave energy is transferred as external energy will be discussed. Finally, in Embodiment 10, a case where optical energy is transferred as external energy will be depicted.

Embodiment 7, which is an ultrasonic transducer in a balanced complex resonance circuit, will be described referring to FIG. 14. A complex resonance circuit 1 of the present invention includes a resonance unit 2-1 that transfer energy and four phase shift circuits 3-1, 3-2, 3-3, and 3-4. This complex resonance circuit 1 provides new means unprecedented in prior art. This means implements a function to continuously vary a frequency of maximum sensitivity of energy transferred to/from the exterior in a broad frequency band by changing only a control phase amount phi that characterizes a phase amount of the four phase shift circuits 3-1, 3-2, 3-3, and 3-4 that is to be varied, with various component values of the resonance unit 2 being fixed.

Figure 14:
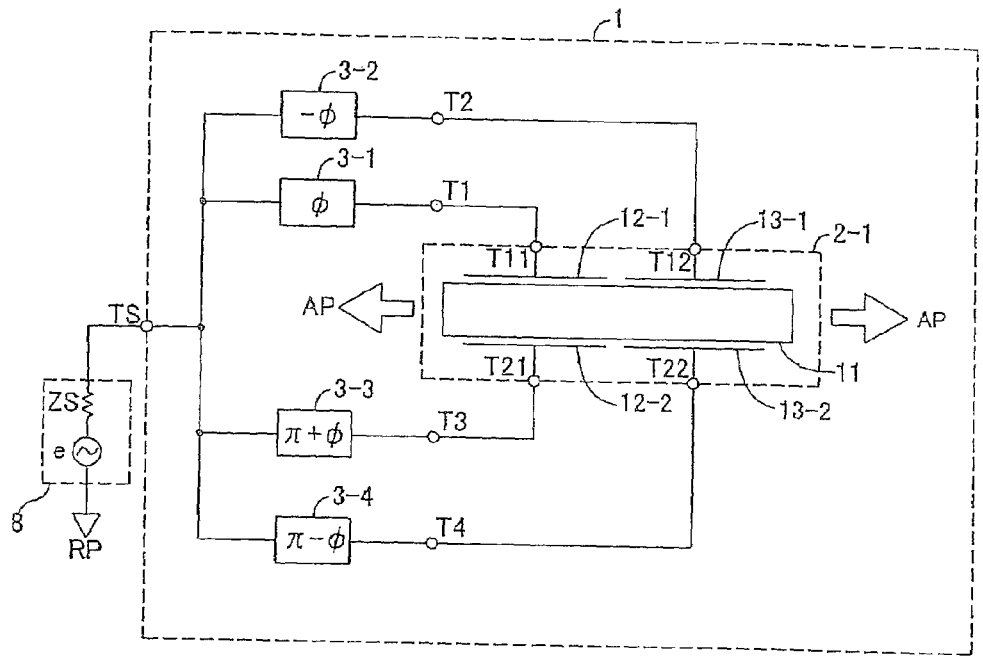
FIG. 14 shows a configuration of an embodiment of a complex resonance circuit 1 for a balanced transducer.

Referring to FIG. 14, a concrete configuration will be described hereinafterbelow. The complex resonance circuit 1 is made up of the following constituent elements: an input terminal TS; a reference terminal RP; the resonance unit 2-1 having a first terminal T11, a second terminal T12, a third terminal T21, and a fourth terminal T22, and transfer energy; the phase shift circuit 3-1 connected between the input terminal TS and the first terminal T11 of the resonance unit 2-1 and shifts a phase by phi; the phase shift circuit 3-2 connected between the input terminal TS and the second terminal T12 of the resonance unit 2-1 and shifts a phase by minus phi; the phase shift circuit 3-3 connected between the input terminal TS and the third terminal T21 of the resonance unit 2-1 and shifts a phase by pi plus phi; the phase shift circuit 3-4 connected between the input terminal TS and the fourth terminal T22 of the resonance unit 2-1 and shifts a phase by pi minus phi. The resonance unit 2-1, which transfers energy, has electrodes 12-1, 12-2, 13-1, and 13-2 sandwiching both major surfaces of a piezoelectric plate 11 made of an x-cut quartz plate. The electrode 12-1 is connected to an external terminal T11, the electrode 12-2 to an external terminal T21, the electrode 13-1 to an external terminal T12, and the electrode 13-2 to an external terminal T22. This resonance unit 2-1 discharges acoustic energy AP in both of longitudinal directions of the piezoelectric plate 11. Therefore, at least this part of the resonance unit 2-1 has a structure exposed to the exterior space.

Next, regarding the operation of this complex resonance circuit 1, a frequency of maximum sensitivity can be changed by changing a control phase amount phi. A frequency of maximum sensitivity (resonance frequency) and a control phase amount phi has a relationship shown in FIG. 3. The principles for such operation have already been explained, and thus, are omitted.

An embodiment as an ultrasonic transducer in an unbalanced complex resonance circuit will be described referring to FIG. 15.

The complex resonance circuit 1 is made up of the following constituent elements: an input terminal TS; a resonance unit 2-1 having a first terminal T11, a second terminal T12, and a reference terminal TRP, and transfer energy; and two phase shift circuits 3-1 and 3-2 respectively connected between each of the first and second terminals and the input terminal, and shift phases so that the phases are reverse to each other. The resonance unit 2-1 is constructed in the following manner: Two x-cut quartz plates 11-1 and 11-2 having substantially a same thickness are prepared. Electrodes 12-1 and 14 are disposed on both major surfaces of one of the quartz plates. Electrodes 14 and 13-1 are disposed on both major surfaces of the other of the plates. These quartz plates are stuck together such that +x direction of crystallographic axes of these quartz plates (directions shown with arrows in FIG. 15) are reverse to each other. The electrode 12-1 is connected to the external electric terminal T11, the electrode 13-1 to the external electric terminal T12, and the electrode 14 to the terminal TRP.

In this complex resonance circuit 1, where a resonance frequency of a phase shift amount phi at zero degrees is F0 and a resonance frequency of the phase shift amount phi at ninety degrees is F90, the ratio of these two frequencies are approximately 1:2. When the phase shift amount phi is shifted at least within the range of zero to ninety degrees referring to Expression 5, frequencies within the band of these two frequencies can be continuously swept.

Here, since the resonance unit 2-1 is configured of x-cut quartz plates, thickness longitudinal vibrations are generated, and ultrasonic energy AP having longitudinal vibrations are discharged to the exterior from both surfaces of the x-cut quartz plates. In this manner, electric energy supplied from a frequency variable reference signal generator 8 is transduced into acoustic energy AP. A frequency that gives a maximum transduction efficiency is a resonance frequency FR. The resonance frequency FR can be arbitrary varied within a set band by controlling the control phase amount phi.

Even if a Q-value is dumped by backing or some other method, which is usually practiced in an ultrasonic transducer, the function of continuously varying of the present invention is maintained.

Figure 15:
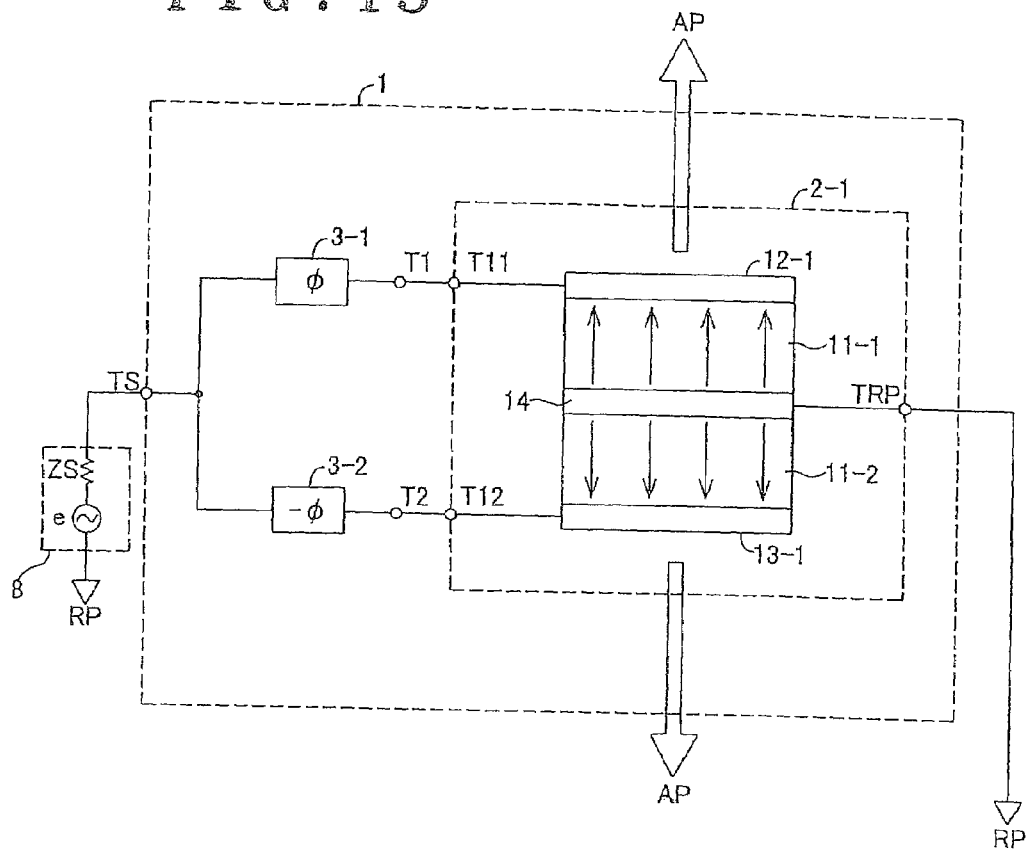
FIG. 15 shows a configuration of an embodiment of a complex resonance circuit 1 for an unbalanced transducer.

In FIG. 15, an embodiment has been described wherein the two x-cut quartz plates 11-1 and 11-2 having substantially a same thickness are used. By using m quartz plates stuck together, where m is three or more, a frequency variable band can be broadened to the ratio of approximately m:1 in proportion to m, which is the number of quartz plate. This corresponds to the resonance unit 2 shown in FIG. 10, which has a cascade connection.

Figure 16:
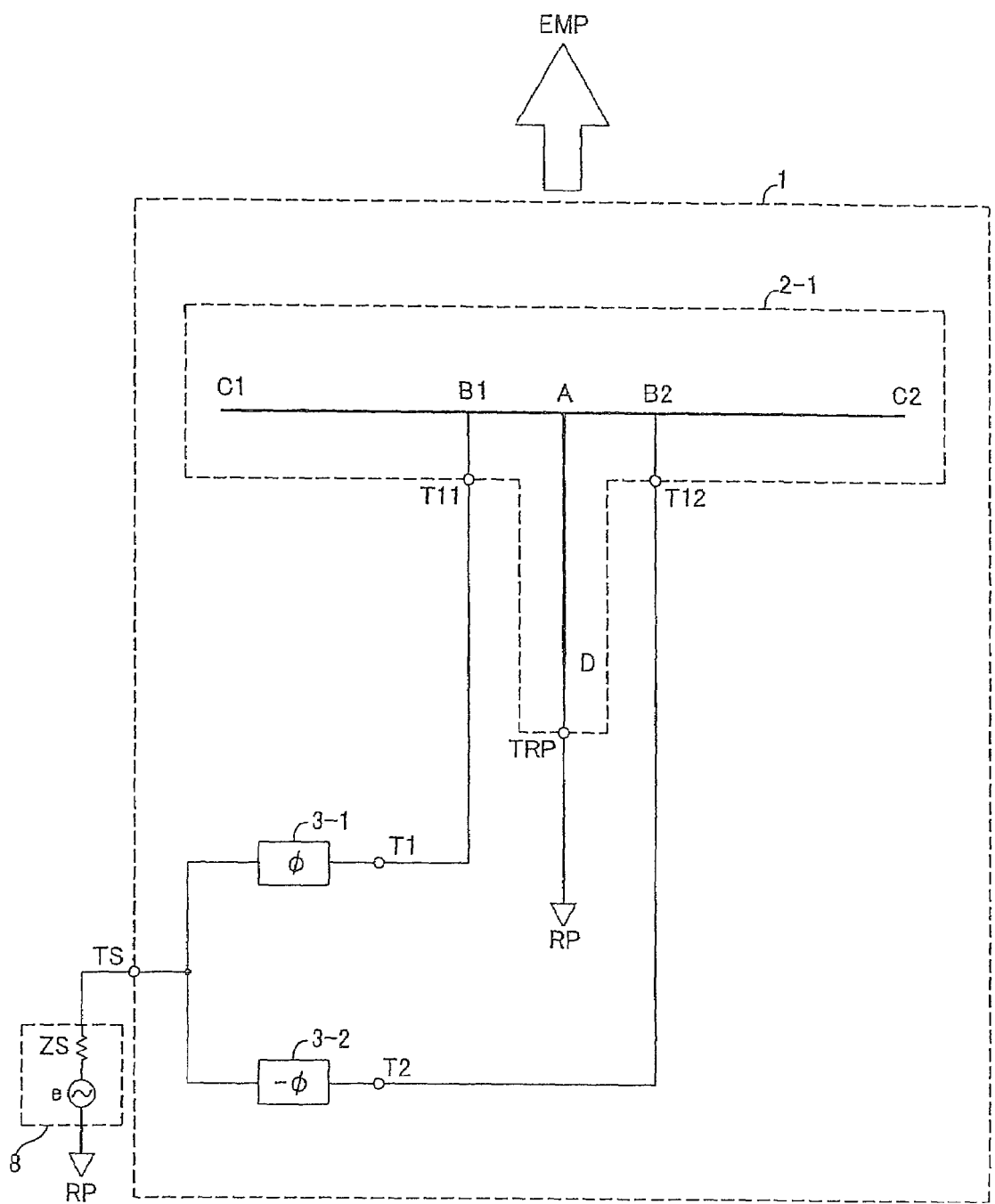
FIG. 16 shows a configuration of an embodiment for an antenna for wireless communication.

Referring to FIG. 16, an embodiment wherein the complex resonance circuit 1 of the present invention is applied to an antenna for wireless communication will be explained. The resonance unit 2-1 shown in FIG. 16 is a T-shaped doublet antenna configured of conductive lines. Auxiliary lines and insulating parts for sustaining the T shape is not essential and therefore not shown. A length of the T shape in a horizontal direction is from C1 to C2. A length in a vertical direction from a point A in a central part is from A to D. Points B1 and B2 are located at points spaced in the horizontal direction from the point A of the resonance unit 2-1. The points B1 and B2 are points to which the terminals T11 and T12 of the resonance unit 2-1 are connected, and respectively connected to the terminals T11 and T12. A point D is located downwardly spaced from the point A of the resonance unit 2-1 and connected to a terminal TRP. The terminal T11 is connected to a terminal T1 via a power feeder. A phase shift circuit 3-1 is connected between the terminals T1 and a terminal TS. The terminal T12 is connected to a terminal T2 via a power feeder. A phase shift circuit 3-2 is connected between the terminals T2 and the terminal TS.

The operation of this complex resonance circuit 1 will be described. A frequency variable reference frequency generator 8 is connected between the terminal TS and a terminal RP. The point D (TRP) of the resonance unit 2-1 is connected to the reference potential RP. When a control phase amount phi is 90 degrees, this resonance unit 2-1 works as a doublet antenna having a length from C1 to C2. When a control phase amount phi is 0 degrees, this resonance unit 2-1 is affected by the conductive line from the point A to D and works as a doublet antenna equivalently having a length different from the length from C1 to C2. By varying a phase control amount phi from 0 to 90 degrees, the doublet antenna behaves as if the length thereof has been effectively changed and discharges electromagnetic wave energy EMP into space. Namely, a frequency of maximum sensitivity can be varied.

The reason the terminal T11 is connected to the point B1 but not to the point C1 of the conductive line is to match a characteristic impedance of the power feeder and a local impedance of the antenna. Therefore, the location of the terminal T11 may be arbitrary adjusted.

The antenna of the resonance unit 2-1 shown in FIG. 16 has a "T shape." However, similar effects can be obtained when the antenna is a "folded type."

Referring to FIG. 17, a case where the present invention is embodied as a surface emitting diode will be described. As shown in a cross sectional view of FIG. 17(a), a resonance unit 2-1 has a p-type distributed Bragg reflecting layers 24 and n-type distributed Bragg reflecting layers 25, which sandwich an active layer 23. On one side of the exterior of the distributed Bragg reflecting layers, split electrodes 12-1 and 13-1 are provided, and on the other side thereof, a common electrode 14 is provided.

FIG. 17(b) shows a planar structure of the split electrodes. Between the split electrodes 12-1 and 13-1, a gap is formed for optical output to be emitted.

The split electrode 12-1 is connected to the terminal T11, the split electrode 13-1 to the terminal T12, and the common electrode to a terminal TRP. Thus, the resonance unit 2-1 is constructed.

Between a terminal T1 and a terminal TS, a phase shift circuit 3-1 that shifts a phase by phi is connected. The terminal T1 is connected to the terminal T11. Between a terminal T2 and the terminal TS, a phase shift circuit 3-2 that shifts a phase by minus phi is connected. The terminal T2 is connected to the terminal T12. The terminal TRP is connected to a reference terminal RP.

The complex resonance circuit 1 operates as follows: Between the terminal TS and the reference potential RP, a frequency variable reference frequency generator 8 is connected and this generator applies high-frequency power. Necessary DC power is superimposed by a DC power source 26. This complex resonance circuit 1 is capable of continuously varying a wavelength of an output light LP in accordance with a control phase amount phi by, for example, the stimulated Raman effect.

Optical energy output LP of is emitted from a gap between the two split electrodes 12-1 and 13-1 in a direction vertical to the surface.

In this case, too, single-mode or multi-mode emissions can be obtained by providing a shielding window and adjusting a size of this window. However, the size of the window may be adjusted such that double-mode emissions can be obtained. The complex resonance circuit 1 of the present invention may be a circuit such as an optical fiber circuit and a space transmission optical circuit configured of prior art optical circuit elements.

Next, an embodiment used for a mass sensor will be explained. First, problems of prior art will be pointed out. As a mass sensor according to conventional technologies, a Quartz Crystal Microbalance (QCM) and many adsorption sensors to which this principle is applied are disclosed, for example, in Japanese Patent Application Kokai No. 2007-85977. Operation principles thereof is to detect a mass of a material attached or sucked on a surface of an vibrator having a single, approximately fixed resonance frequency focusing on the changes in the resonance frequency of the vibrator or the changes in a equivalent impedance at the frequency. However, these adsorption sensors had a problem that no consistent results are produced when transmission of ultrasonic waves into the attached materials is not negligible i.e., when the materials are relatively thickly attached or soft materials are attached. This is because an vibrating frequency in these adsorption sensors is basically fixed although a little variable.

In the complex resonance circuit of the present invention, a resonance frequency is variable in a broad band. Using this feature, an attempt is made to detect a mass of an attached material with high precision.

Figure 18:
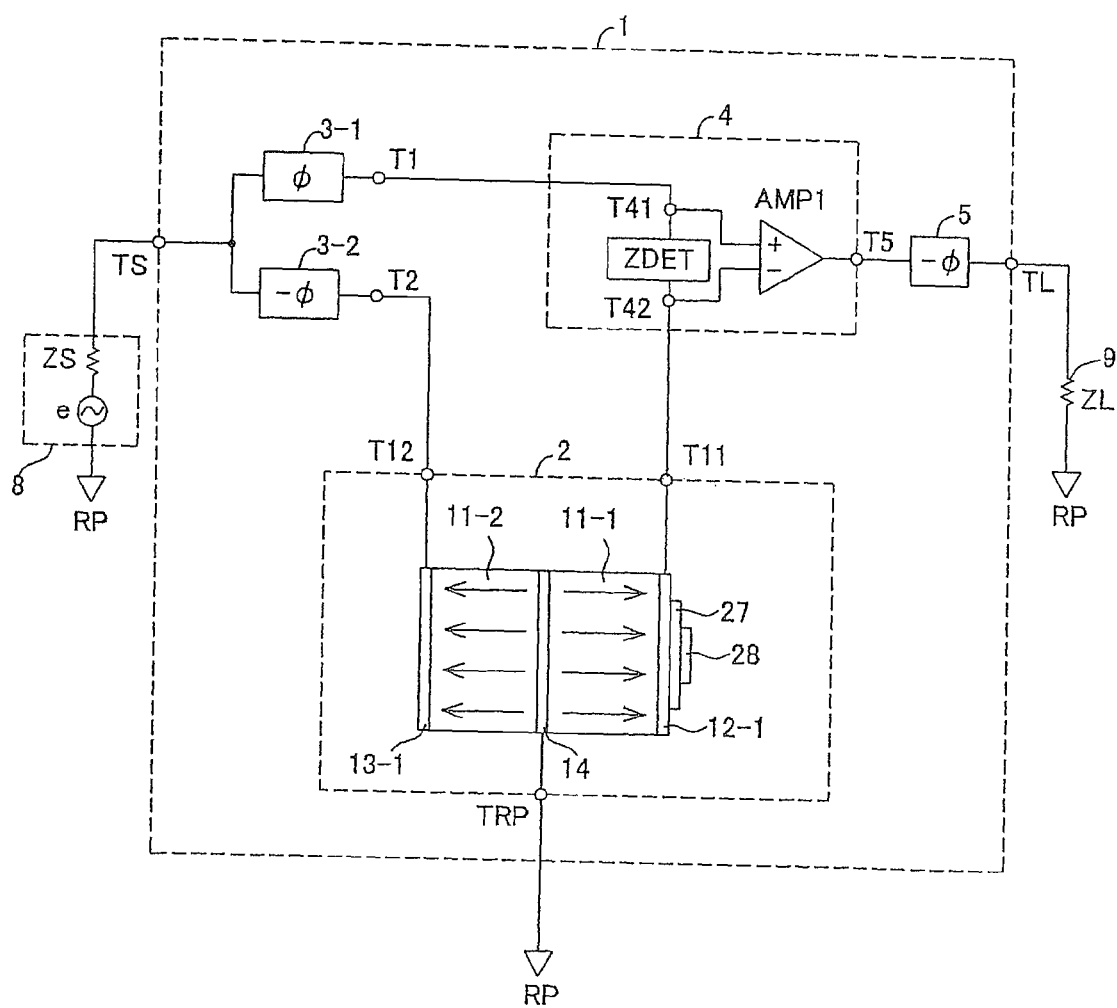
FIG. 18 shows a configuration of an embodiment for a mass sensor.

Referring to FIG. 18, an unbalanced complex resonance circuit will be described an example. This complex resonance circuit 1 is composed of a resonance unit 2 having three terminals, two phase shift circuits 3-1 and 3-2, a resonance output circuit 4, and a phase shift circuit 5.

In FIG. 18, the complex resonance circuit 1 includes the following constituent elements: an input terminal TS; an output terminal TL; reference terminals RP; a resonance unit 2 having a first terminal T11 and a second terminal T12; a phase shift circuit 3-1 connected between the input terminal TS and the terminal T1 and shifts a phase by phi; a resonance output circuit 4 whose input terminals T41 and T42 are connected between the terminal T1 and the first terminal T11 of the resonance unit 2 and whose output is connected to a terminal T5; a phase shift circuit 5 connected between the terminal T5 and the terminal TL; a phase shift circuit 3-2 connected between the input terminal TS and the second terminal T12 of the resonance unit 2 and shifts a phase by minus phi.

The resonance unit 2-1 is constructed in the following manner: Two x-cut quartz plates 11-1 and 11-2 having substantially a same thickness are prepared. Electrodes 12-1 and 14 are disposed on both major surfaces of one of the quartz plates. Electrodes 14 and 13-1 are disposed on both major surfaces of the other of the plates. These quartz plates are stuck together such that +x direction of crystallographic axes of those quartz plate (directions shown with arrows in FIG. 18) are reverse to each other. The electrode 12-1 is connected to the external electric terminal T11, the electrode 13-1 to the external electric terminal T12, and the electrode 14 to the terminal TRP.

The resonance unit 2 has such a structure that the electrode 12-1 is exposed outside to attach materials to be detected. If necessary, a selective adsorption layer 27 to promote efficient adsorption of desired material only is provided at the exterior of the electrode 12-1. Attached material 28 attaches to the exterior of the selective adsorption layer 27.

In this complex resonance circuit 1, where a resonance frequency of a phase shift amount phi at zero degrees is F0 and a resonance frequency of the phase shift amount phi at ninety degree is F90, the ratio of these two frequencies are approximately 1:2. When the phase shift amount phi is shifted at least within the range of zero to ninety degrees referring to Expression 5, frequencies within the band of these two frequencies can be continuously swept. Here, a frequency of when the phase shift amount phi is, for example, 45 degrees varies depending on thicknesses of the selective adsorption layer 27 and attached material 28 and the like. When the phase shift amount phi is shifted within the range of 0 to 90 degrees, the extent of the variation is not constant due to the thicknesses and the like. Focusing on this, a mass of the attached material can be detected with high precision.

When electric attenuation between the terminals TS and TL is observed, the impedance can be calculated. Thus, not only the resonance frequency but also changes in loss component when material is attached can be detected. To observe only changes in frequency, only an absolute value of currents flowing through the terminal 41 should be observed, and thus, the phase shift circuit 5 in not necessary.

Although some of the above described embodiments of the complex circuits include a plurality of phase shift circuits, the same function can be achieved by configurations having less number of phase shift circuits. The reasons for this will be explained. In the vector diagram shown in FIG. 5, a control phase amount phi is expressed by circular arc arrows. As clearly understood from this, phase differences among voltages applied to the first terminal T11, the second terminal T12, the third terminal T21, and the fourth terminal T22 are determined by the phase shift amount phi. As long as the phase differences are determined, phase differences among the plurality of phase shift circuits are maintained even if a phase shift amount having a phase amount phi which is the same as the control phase amount, for example, is added to all of the phase shift amounts of the phase shift circuits. Thus, all the effects of the present invention will be maintained. By such operation, the need for a phase shift circuit wherein a phase difference between input and output is 0, i.e. input and output has a same phase can be eliminated. Embodiments for this type of complex circuits will be explained hereinbelow divided into cases where a resonance unit 2 is a balanced type and where a resonance unit 2 is an unbalanced type.

The case where the resonance unit 2 is a balanced type will be described referring to FIG. 19. A configuration thereof is as follows.

Figure 19:
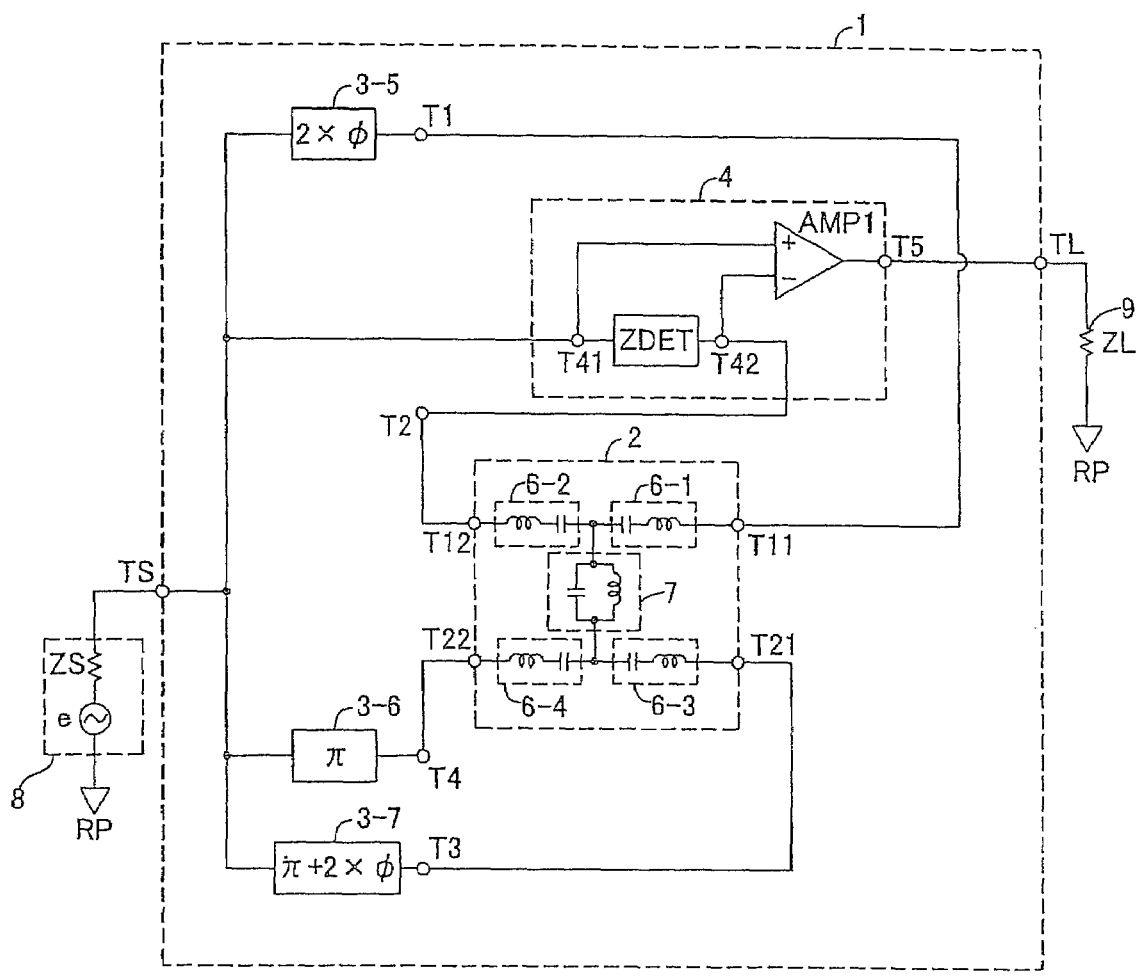
FIG. 19 shows a configuration of an embodiment of a balanced complex resonance circuit 1.

In FIG. 19, a complex resonance circuit 1 includes the following constituent elements: an input terminal TS; an output terminal TL; reference terminals RP; a resonance unit 2 having a first terminal T11, a second terminal T12, a third terminal T21, and a fourth terminal T22; a phase shift circuit 3-5 connected between the input terminal TS and a terminal T1 and shifts a phase by 2 multiplied by phi; a resonance output circuit 4 connected to the terminal 1 and the first terminal T11 and whose input terminals T41 and T42 are connected between the input terminal TS and the second terminal T12 of the resonance unit 2, and whose output terminal is connected to the output terminal TL; a phase shift circuit 3-7 connected between the input terminal TS and the third terminal T21 of the resonance unit 2 and shifts a phase by pi plus 2 multiplied by phi; and a phase shift circuit 3-6 connected between the input terminal TS and the fourth terminal T22 of the resonance unit 2 and shifts a phase by pi.

The resonance unit 2 includes at least a pair of serial resonance characteristic elements 6-1 and 6-2, at least a pair of serial resonance characteristic elements 6-3 and 6-4, and a reactance circuit 7. The elements 6-1 and 6-2 are connected between the first terminal T11 and the second terminal T12. An end of each of the elements 6-1 and 6-2 are connected to each other at a midpoint therebetween, and the elements 6-1 and 6-2 have a resonance frequency substantially identical to each other. The elements 6-3 and 6-4 are connected between the third terminal T21 and the fourth terminal T22. An end of each of the elements 6-3 and 6-4 are connected to each other at a midpoint therebetween, and the elements 6-3 and 6-4 have a resonance frequency substantially identical to each other. The reactance circuit 7 is connected between a midpoint of the elements 6-1 and 6-2, and a midpoint of the elements 6-3 and 6-4.

In other words, a phase shift circuit of the complex resonance circuit 1 is composed of three circuits of phase shift circuits 3-5, 3-6, and 3-7.

In a case where this resonance unit is a balanced circuit, still another embodiment will be described referring to FIG. 20.

Figure 20:
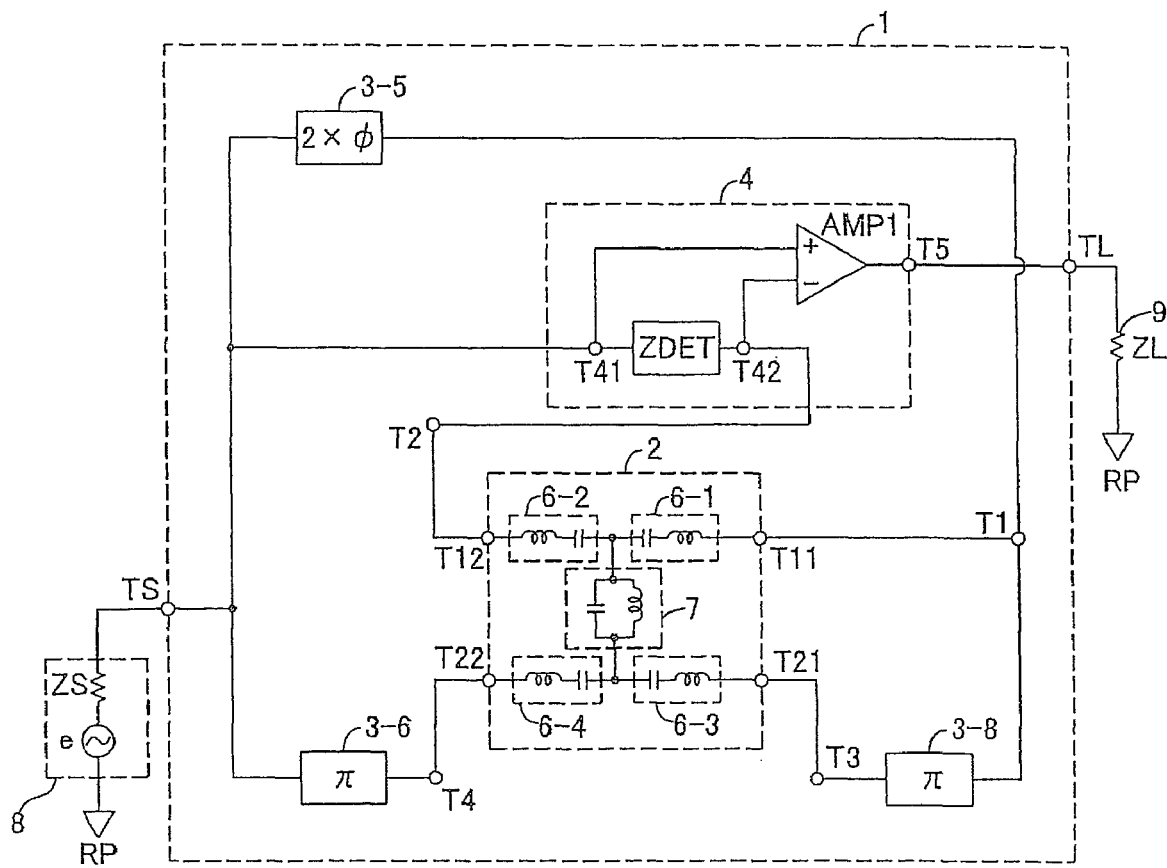
FIG. 20 shows a configuration of another embodiment of a balanced complex resonance circuit 1.

In FIG. 20, a complex resonance circuit 1 includes the following constituent elements: an input terminal TS; an output terminal TL; reference terminals RP; a resonance unit 2 having a first terminal T11, a second terminal T12, a third terminal T21, and a fourth terminal T22; a phase shift circuit 3-5 connected between the input terminal TS and a terminal T1 and shifts a phase by 2 multiplied by phi; a resonance output circuit 4 wherein the terminal T1 is connected to the first terminal T11 of the resonance unit 2, and whose input terminals T41 and T42 are connected between the input terminal TS and the second terminal T12 of the resonance unit 2, and whose output is connected to the output terminal TL; a phase shift circuit 3-8 connected between the input terminal TS and the third terminal T21 of the resonance unit 2 and shifts a phase by pi; and a phase shift circuit 3-6 connected between the input terminal TS and the fourth terminal T22 of the resonance unit 2 and shifts a phase by pi.

The resonance unit 2 includes at least a pair of serial resonance characteristic elements 6-1 and 6-2, at least a pair of serial resonance characteristic elements 6-3 and 6-4, and a reactance circuit 7. The elements 6-1 and 6-2 are connected between the first terminal T11 and the second terminal T12. An end of each of the elements 6-1 and 6-2 are connected to each other at a midpoint therebetween, and the elements 6-1 and 6-2 have a resonance frequency substantially identical to each other. The elements 6-3 and 6-4 are connected between the third terminal T21 and the fourth terminal T22. An end of each of the elements 6-3 and 6-4 are connected to each other at a midpoint therebetween, and the elements 6-3 and 6-4 have a resonance frequency substantially identical to each other. The reactance circuit 7 is connected between a midpoint of the elements 6-1 and 6-2, and a midpoint of the elements 6-3 and 6-4.

In other words, a phase shift circuit of the complex resonance circuit 1 is composed of phase shift circuits 3-5, 3-6, and 3-8.

In the embodiments shown in FIGS. 19 and 20, the phase shift circuits 3-6 and 3-8 are circuits that shift a phase by a fixed amount pi, and therefore, can be implemented by using devices such as an inverting amplifier.

In the embodiment shown in FIG. 20, a phase difference, for example, between the terminals T1 and T3 is 180 degrees, and therefore, the phase shift circuit can be implemented by devices such as a push-pull amplifier having phases thereof inverted to each other.

Next, a case where the resonance unit 2 is an unbalanced type will be described referring to FIG. 21. The configuration thereof is as follows.

Figure 21:
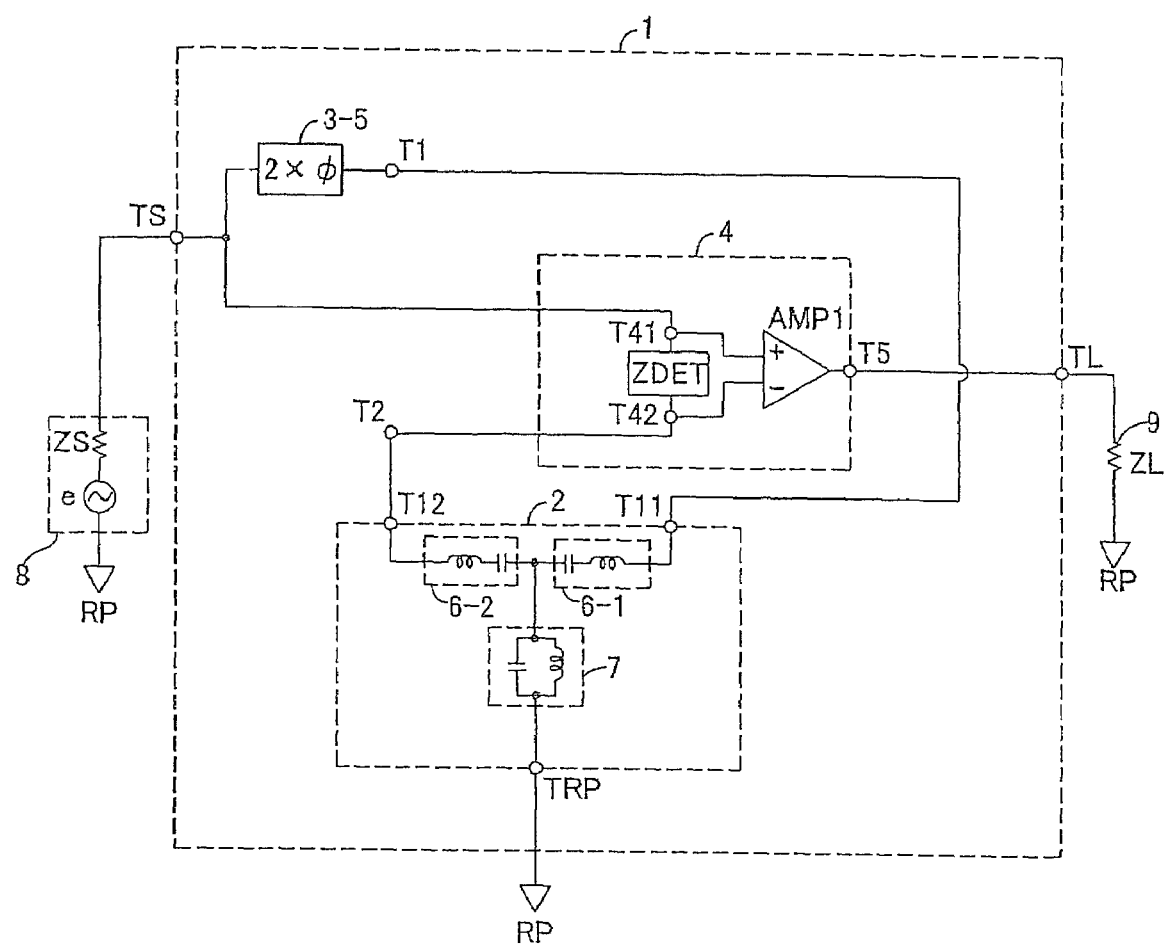
FIG. 21 shows a configuration of an embodiment of an unbalanced complex resonance circuit 1.

In FIG. 21, the complex resonance circuit 1 includes the following constituent elements: an input terminal TS; an output terminal TL; reference terminals RP; a resonance unit 2 having a first terminal T11, a second terminal T12, and a reference terminal TRP; a phase shift circuit 3-5 connected between the input terminal TS and a terminal T1 and shifts a phase by 2 multiplied by phi; a resonance output circuit 4 wherein a terminal T1 is connected to the first terminal T11 of the resonance unit 2, and whose input terminals T41 and T42 are connected between the input terminal TS and the second terminal T12 of the resonance unit 2, and whose output is connected to the output terminal TL.

The resonance unit 2 includes at least a pair of serial resonance characteristic elements and a reactance circuit. The elements are connected between the first and second terminals. One end of each of the elements is connected to each other at a midpoint therebetween, and the elements have a substantially equal resonance frequency. The reactance circuit is connected between the midpoint and the reference terminal.

Prior art teaches that, in any of the embodiments described above, the resonance unit 2 can be configured as any of the two types, balance or unbalanced, in either case where the resonance unit 2 is configured by a lumped-parameter element or a distributed constant circuit The complex resonance circuit of the present invention has a configuration completely different from that of a prior art band-pass filter. The differences will be explained hereinbelow.

(a) A connection configuration of input and output is different. More specifically, the complex resonator 2 of the present invention is a 6-terminal network (three-pair terminal circuit) even in its minimum configuration. On the other hand, a minimum configuration of a conventional filter is a 4-terminal network (two-pair terminal circuit). Thus, the complex resonance circuit is essentially a different invention from conventional band-pass filters. However, in the case where a transducer is used, six terminals are provided, two of which are transduced for converted energy.

(b) Design values are fundamentally different particularly from a piezoelectric filter. A piezoelectric filter does not work when two frequencies are separated more than an electromechanical coupling factor. The device of the present invention fully works. A frequency can be varied beyond the previous limits.

The following are the effects of the present invention for which the applicant claims inventive step and which cannot be produced by prior art.

(c) In a filter device, an input output impedance to be connected to a minimum configuration of a 4-terminal circuit is selected to have a value related to the band frequency. Although a concept of input output impedance is not included in the present invention, to venture to compare, an impedance on a power side is adjusted to a value related to loss of the resonance unit. When high purity signal is required, the impedance on the power side is set as small as possible to prevent deterioration of a loaded Q-value. In a resonance unit, a high Q-value can be achieved by loosely coupling an external electrical terminal.

(d) Regarding output information, the complex resonance circuit of the present invention is a singly-resonant frequency-variable device and, unlike a band-pass filter, does not make a response of a broad frequency band for a predetermined band.

The contrast between the complex resonance circuit of the present invention and a prior art filter described above is presented in a Table 1.

TABLE 1

| | | Complex Resonance Circuit of the Present Invention | Prior Art Filter |
|---|---|---|---|
| (a) | Connection for Input/Output | 6-terminal Circuit | 4-terminal Circuit |
| (b) | Frequency Allocation | Allocated Irrelevantly to Piezoelectricity | Allocated within the Limits of Piezoelectricity |
| (c) | Input/Output Termination Resistance | Relevant to a Q-value | Closely Relevant to Amplitude or Phase Characteristics |
| (d) | Applications | For Continuously Varying a Single Frequency | For Passing Frequency Band Having a Bandwidth |

As described thus far, the complex resonance circuit of the present invention is capable of continuously varying frequency bands of two arbitrary-set natural resonance frequencies while maintaining high-purity frequencies for at least a broad frequency band beyond limits of piezoelectricity by combining a resonance unit 2 with a phase shift circuit and controlling a control phase amount. Therefore, the applicant believes that the complex resonance circuit of the present invention has novelty and inventive step.

What is claimed is:

1. A complex resonance circuit comprising:
   an input terminal;
   an output terminal;
   a resonance unit having a first and second terminal, and a reference terminal;
   a phase shift circuit that shifts in phase an input signal supplied thereto via said input terminal so as to produce two phase-shifted signals which are respectively shifted in phase differently from each other and supplied to said first and second terminals through two circuit paths; and
   a resonance output circuit that supplies to said output terminal a resonance output corresponding to a magnitude of a current sent from said phase shift circuit, said resonance output circuit being inserted within either one of said two circuit paths,
   wherein said resonance unit includes:
   at least a pair of serial resonance characteristic elements that are connected between said first and second terminals, an end of each of the elements connected to each other at a midpoint therebetween, and the elements having a resonance frequency substantially identical to each other; and
   a reactance circuit connected between said midpoint and said reference terminal.

2. The complex resonance circuit according to claim 1, wherein said resonance unit includes first and second piezoelectric layer units, a reference electrode layer sandwiched between said first and second piezoelectric layer units, and a pair of outermost electrodes that are respectively disposed onto outer surfaces of said first and second piezoelectric layer units, and
   wherein said reference electrode layer is connected to said reference terminal and said outermost electrodes of said first and second piezoelectric layer units are connected to said first and second terminals, respectively.

3. The complex resonance circuit according to claim 1, wherein said resonance unit includes a piezoelectric layer, a reference electrode layer disposed on one surface of said piezoelectric layer a pair of electrodes disposed on the other surface of said piezoelectric layer, and a substrate supporting said reference electrode layer via a multi-layer structure.

4. The complex resonance circuit according to claim 1, wherein said resonance unit includes a first stripline connected between said first and second terminals, and a second stripline connected between a midpoint of said stripline and said reference terminal, said first stripline functioning as said serial resonance characteristic elements and said second stripline functioning as said reactance circuit.

5. The complex resonance circuit according to claim 1, wherein said resonance unit is configured of a Micro Electro Mechanical System (MEMS) element,
said MEMS elements includes an upper reflecting layer, a lower reflecting layer, an active layer sandwiched by said upper and lower reflecting layers, a pair of electrodes disposed on said upper reflecting layer, and a common electrode disposed on said lower reflecting layer.

6. A complex resonance circuit comprising:
an input terminal;
an output terminal;
a resonance unit having a first, second, third, and fourth terminal;
a first phase shift circuit that shifts in phase an input signal supplied thereto via said input terminal so as to produce two phase-shifted signals which are respectively shifted in phase differently from each other and supplied to said first and second terminals through first and second circuit paths;
a second phase shift circuit that shifts in phase said input signal supplied thereto via said input terminal so as to produce two phase-shifted signals which are respectively shifted in phase differently from each other and different from said first phase shift circuit and supplied to said third and fourth terminals through third and fourth circuit paths; and
a resonance output circuit that supplies to said output terminal a resonance output corresponding to a magnitude of a current sent from either of said first and second phase shift circuits, said resonance output circuit being inserted within either one of said first, second, third, and fourth paths,
wherein said resonance unit includes:
at least a pair of serial resonance characteristic elements that are connected between said first and second terminals and between said third and fourth terminals, an end of each of the elements connected to each other at respective midpoints therebetween, and the elements having a resonance frequency substantially identical to each other; and a reactance circuit connected between said respective midpoints.

7. The complex resonance circuit according to claim 6, wherein said resonance unit includes a piezoelectric substrate and at least two pairs of electrodes provided on said piezoelectric substrate, said piezoelectric substrate functioning as said pairs of serial resonance characteristic elements and said reactance circuit, and
wherein said first and second terminals are connected to respective electrodes of said electrode pairs and said third and fourth terminals are connected to the respective other electrodes of said electrode pairs.

8. The complex resonance circuit according to claim 6, wherein said resonance unit includes a first stripline connected between said first and second terminals, and a second stripline connected between said third and fourth terminals, a third stripline connected between respective midpoints of said first and second striplines, said first stripline functioning as said serial resonance characteristic elements between said first and second terminals, said second stripline functioning as said serial resonance characteristic elements between said third and fourth terminals, said third stripline functioning as said reactance circuit.

9. A complex resonance circuit comprising: an input terminal; a resonance unit having first and second terminals, and a reference terminal; and
a phase shift circuit that shifts in phase an input signal supplied thereto via said input terminal so as to produce two phase-shifted signals which are respectively shifted in phase differently from each other and supplied to said first and second terminals,
wherein said resonance unit includes:
a first piezoelectric body connected between said first terminal and said reference terminal; and
a second piezoelectric body connected between said second terminal and said reference terminal and having a resonance frequency substantially equal to that of said first piezoelectric body,
wherein said first and second piezoelectric bodies are coupled to each other via said reference terminal, and
wherein said resonance unit has an exposed structure.

10. A complex resonance circuit comprising:
an input terminal;
an output terminal;
a resonance unit having a first, second, third, and fourth terminal;
a first phase shift circuit that shifts in phase an input signal supplied thereto via said input terminal so as to produce two phase-shifted signals which are respectively shifted in phase differently from each other and supplied to said first and second terminals; and
a second phase shift circuit that shifts in phase said input signal supplied thereto via said input terminal so as to produce two phase-shifted signals which are respectively shifted in phase differently from each other and different from said first phase shift circuit and supplied to said third and fourth terminals,
wherein said resonance unit includes a first piezoelectric body connected between said first and second terminals; and
a second piezoelectric body connected between said third and fourth terminals, wherein said first and second piezoelectric bodies are coupled to each other by mechanical vibrations, and
wherein said resonance unit has an exposed structure.

* * * * *